(12) United States Patent
Yamazaki et al.

(10) Patent No.: US 8,809,852 B2
(45) Date of Patent: Aug. 19, 2014

(54) SEMICONDUCTOR FILM, SEMICONDUCTOR ELEMENT, SEMICONDUCTOR DEVICE, AND METHOD FOR MANUFACTURING THE SAME

(75) Inventors: Shunpei Yamazaki, Setagaya (JP); Masahiro Takahashi, Atsugi (JP); Tetsunori Maruyama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 286 days.

(21) Appl. No.: 13/303,543

(22) Filed: Nov. 23, 2011

(65) Prior Publication Data
US 2012/0132907 A1 May 31, 2012

(30) Foreign Application Priority Data
Nov. 30, 2010 (JP) ................. 2010-267924

(51) Int. Cl.
*H01L 29/10* (2006.01)

(52) U.S. Cl.
USPC .............. 257/43; 257/E21.459; 257/E21.46; 257/E21.449; 257/E29.094; 257/627; 257/E31.04; 257/E29.003; 257/E29.004; 438/104; 438/149; 438/150; 438/197; 438/198

(58) Field of Classification Search
None
See application file for complete search history.

(56) References Cited

U.S. PATENT DOCUMENTS

| | | | |
|---|---|---|---|
| 5,528,032 A | 6/1996 | Uchiyama | |
| 5,625,202 A | 4/1997 | Chai | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp 2541-2543.

(Continued)

*Primary Examiner* — Fei Fei Yeung Lopez
(74) *Attorney, Agent, or Firm* — Eric J. Robinson; Robinson Intellectual Property Law Office, P.C.

(57) ABSTRACT

One of objects is to provide a semiconductor film having stable characteristics. Further, one of objects is to provide a semiconductor element having stable characteristics. Further, one of objects is to provide a semiconductor device having stable characteristics. Specifically, a structure which includes a seed crystal layer (seed layer) including crystals each having a first crystal structure, one of surfaces of which is in contact with an insulating surface, and an oxide semiconductor film including crystals growing anisotropically, which is on the other surface of the seed crystal layer (seed layer) may be provided. With such a heterostructure, electric characteristics of the semiconductor film can be stabilized.

19 Claims, 15 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,893,495 B2 | 2/2011 | Li et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0056984 A1 | 3/2008 | Yoshioka et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123130 A1 | 5/2010 | Akimoto et al. |
| 2010/0163874 A1 | 7/2010 | Koyama et al. |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |
| 2011/0068335 A1 | 3/2011 | Yamazaki et al. |
| 2011/0084271 A1 | 4/2011 | Yamazaki et al. |
| 2011/0108837 A1 | 5/2011 | Yamazaki et al. |
| 2011/0127521 A1 | 6/2011 | Yamazaki |
| 2011/0127522 A1 | 6/2011 | Yamazaki |
| 2011/0127523 A1 | 6/2011 | Yamazaki |
| 2011/0127579 A1 | 6/2011 | Yamazaki |
| 2011/0133180 A1 | 6/2011 | Yamazaki |
| 2011/0151618 A1 | 6/2011 | Yamazaki et al. |
| 2011/0193083 A1 | 8/2011 | Kim et al. |
| 2012/0119205 A1 | 5/2012 | Taniguchi et al. |
| 2012/0132903 A1 | 5/2012 | Yamazaki et al. |
| 2012/0132904 A1 | 5/2012 | Yamazaki |
| 2012/0132905 A1 | 5/2012 | Yamazaki |
| 2012/0132906 A1* | 5/2012 | Yamazaki ........... 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-026119 | 1/2000 |
| JP | 2000-044236 A | 2/2000 |
| JP | 2000-150900 A | 5/2000 |
| JP | 2002-076356 | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2009-231613 | 10/2009 |
| JP | 2010-016347 | 1/2010 |
| JP | 4415062 | 2/2010 |
| JP | 2010-067954 | 3/2010 |
| JP | 2010-177431 | 8/2010 |
| JP | 4571221 | 10/2010 |

(56) References Cited

FOREIGN PATENT DOCUMENTS

| JP | 2012-160679 | 8/2012 |
|---|---|---|
| WO | WO-2004/114391 | 12/2004 |
| WO | WO2008/133345 | 11/2008 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09: SID International Sympostium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID

(56) References Cited

OTHER PUBLICATIONS

Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, or Zn]at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", *Zeitschrift fur Kristallographie,* 2005, vol.220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

* cited by examiner second crystal structure second crystal structure first crystal structure first crystal structure

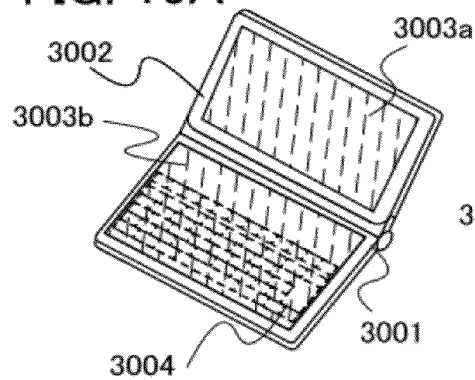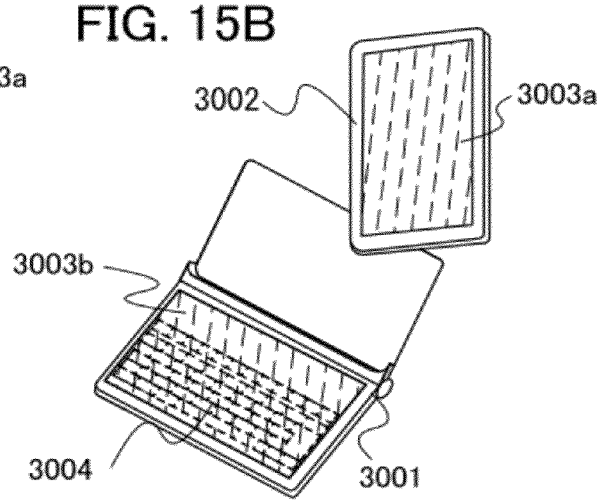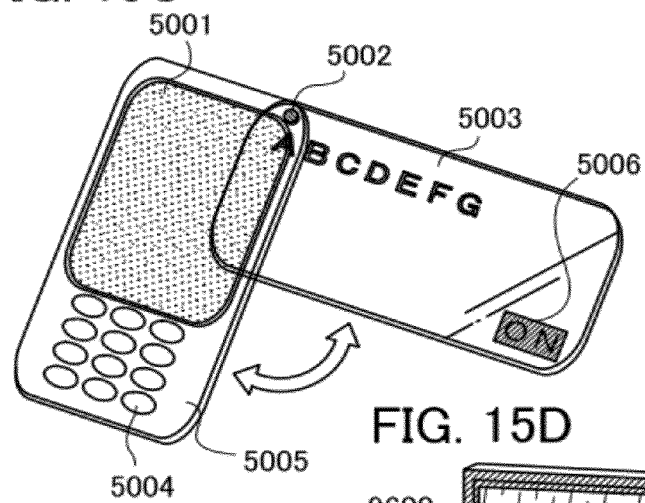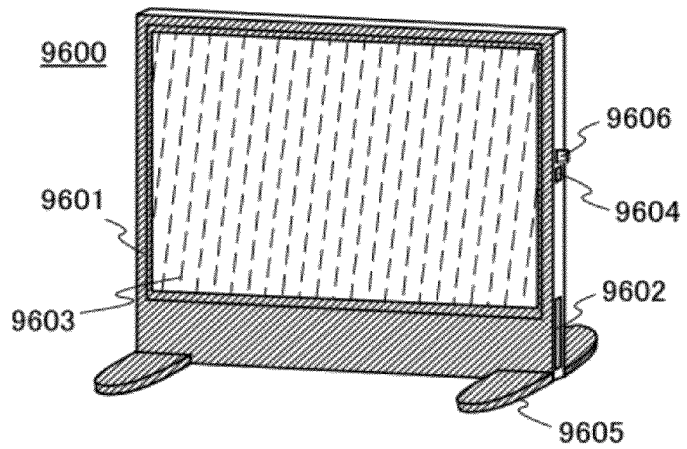

SEMICONDUCTOR FILM, SEMICONDUCTOR ELEMENT, SEMICONDUCTOR DEVICE, AND METHOD FOR MANUFACTURING THE SAME

BACKGROUND OF THE INVENTION

1. Field of the Invention

The present invention relates to a semiconductor film having a heterostructure, a semiconductor element in which the semiconductor film having a heterostructure is used, and a semiconductor device in which the semiconductor film having a heterostructure is used.

Note that in this specification, a semiconductor film refers to a semiconductor in a film shape, a semiconductor element refers to general elements which function by utilizing semiconductor characteristics, and a semiconductor device refers to general devices using the semiconductor element. Thus, electro-optical devices, semiconductor circuits, and electronic devices are all included in the category of the semiconductor device.

2. Description of the Related Art

In recent years, techniques in which thin film transistors (TFTs) are formed using a semiconductor thin film (with a thickness of approximately several nanometers to several hundreds of nanometers) which is formed over a substrate having an insulating surface have attracted attention. Thin film transistors are applied to a wide range of electronic devices such as ICs or electro-optical devices, and prompt development of thin film transistors that are to be used as switching elements in image display devices, in particular, is being pushed. In addition, there are various kinds of metal oxides, which are used for a wide range of applications. Indium oxide is, for example, a well-known material and is used as a light-transmitting electrode material which is necessary for liquid crystal displays and the like.

Some metal oxides have semiconductor characteristics. Examples of a metal oxide having semiconductor characteristics include tungsten oxide, tin oxide, indium oxide, and zinc oxide. Such a metal oxide having semiconductor characteristics can be used for a variety of semiconductor elements such as a sensor and a transistor as well as a transparent conductive film. A thin film transistor in which a channel formation region is formed using such a metal oxide in a film shape is already known (Patent Documents 1 and 2).

REFERENCE

[Patent Document 1] Japanese Published Patent Application No. 2007-123861

[Patent Document 2] Japanese Published Patent Application No. 2007-096055

SUMMARY OF THE INVENTION

A desirable semiconductor film has stable characteristics with little variation. In particular, semiconductor elements need to have little variation therebetween, and the semiconductor film preferably has uniformity and few defects.

Specifically, in the case where a transistor is formed using an oxide semiconductor film, the oxide semiconductor film which is in contact with an insulating film affects electric characteristics of the transistor. In particular, when the oxide semiconductor film in a region with low crystallinity is in contact with an insulating film provided on a gate electrode side, the electric characteristics of the transistor might be potentially degraded.

The present invention is made in view of the foregoing technical background. Thus, one of objects of the present invention is to provide a semiconductor film having stable characteristics.

Further, another object is to provide a semiconductor element having stable characteristics.

Further, another object is to provide a semiconductor device having stable characteristics.

In order to achieve the above objects, in the present invention, an attention has been paid to a surface of a semiconductor film in contact with a surface having an insulating property (an insulating surface), and an attention has been particularly focused on a crystal structure of the surface of the semiconductor film. Then, the present inventors thought up a structure in which the surface of the oxide semiconductor film, which is in contact with the insulating surface, has a region with high crystallinity, thereby reaching achievement of the above objects for the following reason. In a structure where the semiconductor film in a region with high crystallinity is in contact with an insulating surface, an interface state caused by a dangling bond is decreased at an interface between the insulating surface and the semiconductor film, whereby a favorable interface state can be realized.

Specifically, a heterostructure may be formed, which includes a seed crystal layer (a seed layer) including crystals each having a first crystal structure with c-axis alignment (hereinafter, the structure is also referred to as a c-axis-aligned first crystal structure) and an oxide semiconductor film including crystals each having a second crystal structure with c-axis alignment (hereinafter, the structure is also referred to as a c-axis-aligned second crystal structure). In addition, one of surfaces of the seed crystal layer (seed layer) may be in contact with an insulating surface, and the other surface of the seed crystal layer (seed layer) may be bonded to the crystals each having the second crystal structure. With such a heterostructure, electric characteristics of the semiconductor film can be stabilized. Note that the first crystal structure is a wurtzite-type structure, and the second crystal structure is a hexagonal crystal structure other than the wurtzite type, or any one of a $YbFe_2O_4$ structure, a $Yb_2Fe_3O_7$ structure, and a deformed structure of the foregoing structures. Note that between the crystals each having the c-axis-aligned first crystal structure, c-axes of the first crystal structures are aligned in the same direction (e.g., a direction vertical to a substrate surface supporting the seed crystal layer or a surface of the seed crystal layer).

In other words, one embodiment of the present invention is a semiconductor film having a heterostructure which includes: a seed crystal layer including crystals each having a first crystal structure, one of surfaces of which is in contact with an insulating surface; and an oxide semiconductor film including crystals each having a second crystal structure, which is in contact with the other surface of the seed crystal layer. The first crystal structure is a wurtzite-type crystal structure, and the second crystal structure is a hexagonal crystal structure other than the wurtzite type.

Further, one embodiment of the present invention is a semiconductor film having a heterostructure which includes: a seed crystal layer including crystals each having a first crystal structure, one of surfaces of which is in contact with an insulating surface; and an oxide semiconductor film including crystals each having a second crystal structure, which is in contact with the other surface of the seed crystal layer. The first crystal structure is a wurtzite-type crystal structure, and the second crystal structure is any one of a $YbFe_2O_4$ structure, a $Yb_2Fe_3O_7$ structure, and a deformed structure of the foregoing structures.

According to the above embodiments of the present invention, the seed crystal layer including crystals each having the c-axis-aligned first crystal structure is formed to be in contact with the insulating surface, so that an amorphous region whose electric characteristics are unstable is hardly formed to be in contact with the insulating surface. In addition, the oxide semiconductor film in which crystals each having the second crystal structure are bonded to the seed crystal layer including crystals each having the c-axis-aligned first crystal structure to grow. Thus, in the semiconductor film, the seed crystal layer with high crystallinity is in contact with the insulating surface, and the interface state caused by a dangling bond is decreased. As a result, a semiconductor film having a heterostructure provided with a favorable interface state can be provided.

Further, one embodiment of the present invention is the semiconductor film having a heterostructure in which a thickness of the seed crystal layer is greater than or equal to 0.1 nm and less than or equal to 10 nm.

Further, one embodiment of the present invention is the semiconductor film having a heterostructure in which the seed crystal layer contains indium nitride or gallium nitride.

Further, one embodiment of the present invention is the semiconductor film having a heterostructure in which the seed crystal layer contains zinc, indium, gallium, oxygen, and nitrogen.

Further, one embodiment of the present invention is the semiconductor film having a heterostructure in which the seed crystal layer contains nitrogen at a concentration higher than or equal to 0.1 at. % and lower than 5 at. %.

Further, one embodiment of the present invention is the semiconductor film having a heterostructure in which the oxide semiconductor film contains nitrogen at a concentration higher than or equal to $1\times10^{17}/cm^3$ and lower than $5\times10^{19}/cm^3$.

Further, one embodiment of the present invention is a semiconductor element having a heterostructure, including a gate electrode, a first insulating film in contact with the gate electrode, a semiconductor film having a heterostructure which is in contact with the first insulating film and overlaps with the gate electrode, and a second insulating film in contact with the semiconductor film having a heterostructure. The semiconductor film having a heterostructure includes: a seed crystal layer including crystals each having a first crystal structure, which is in contact with the first insulating film; and an oxide semiconductor film including anisotropic crystals each having a c-axis-aligned second crystal structure, which is in contact with the second insulating film. In addition, the first crystal structure is a wurtzite-type crystal structure, and the second crystal structure is a hexagonal crystal structure other than the wurtzite type.

Further, one embodiment of the present invention is a semiconductor element having a heterostructure, including a gate electrode, a first insulating film in contact with the gate electrode, a semiconductor film having a heterostructure which is in contact with the first insulating film and overlaps with the gate electrode, and a second insulating film in contact with the semiconductor film having a heterostructure. The semiconductor film having a heterostructure includes: a seed crystal layer including crystals each having a first crystal structure, which is in contact with the first insulating film; and an oxide semiconductor film including anisotropic crystals each having a c-axis-aligned second crystal structure, which is in contact with the second insulating film. In addition, the first crystal structure is a wurtzite-type crystal structure, and the second crystal structure is any one of a $YbFe_2O_4$ structure, a $Yb_2Fe_3O_7$ structure, and a deformed structure of the foregoing structures.

According to the above embodiments of the present invention, the seed crystal layer including crystals each having the c-axis-aligned first crystal structure is formed to be in contact with the first insulating film which is in contact with the gate electrode. In addition, the oxide semiconductor film including crystals which grow anisotropically is provided. Thus, the semiconductor film having a heterostructure is in contact with the first insulating film in a favorable interface state and overlaps with the gate electrode, and as a result, a semiconductor element having stable electric characteristics can be provided.

Further, one embodiment of the present invention is a semiconductor device including the semiconductor element.

According to the above embodiments of the present invention, with use of the semiconductor element in which the semiconductor film having a heterostructure in contact with the insulating film in a favorable interface state is employed, a semiconductor device with excellent reliability can be provided.

Note that in this specification, a layer including a c-axis-aligned crystal structure indicates a layer in which a c-axis of a crystal structure is aligned in a direction substantially vertical to a surface of the semiconductor stacked layer, and which is a non-single-crystal layer.

Note that in this specification, a hexagonal crystal structure refers to a hexagonal crystal family. Alternatively, a hexagonal crystal structure refers to trigonal and hexagonal crystal systems. A light-emitting device in this specification means an image display device, a light-emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

According to the present invention, a semiconductor film having stable characteristics can be provided.

Further, a semiconductor element having stable characteristics can be provided.

Further, a semiconductor device having stable characteristics can be provided.

BRIEF DESCRIPTION OF THE DRAWINGS

FIGS. 15A to 15D illustrate electronic devices according to an embodiment.

DETAILED DESCRIPTION OF THE INVENTION

Figure 1A:
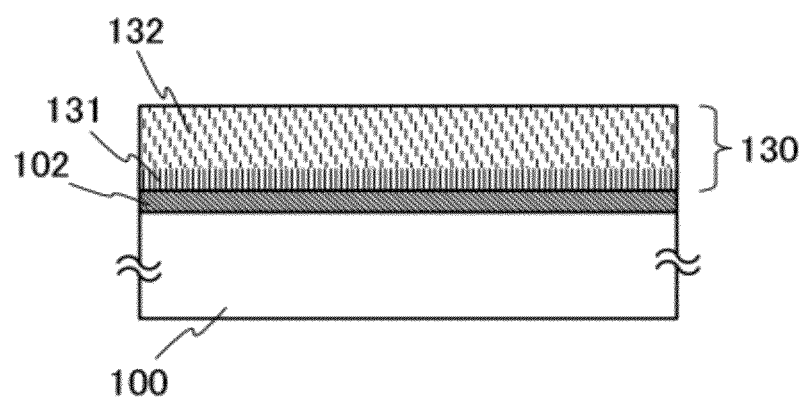
FIGS. 1A and 1B illustrate a semiconductor film having a heterostructure according to an embodiment.

Embodiments of the present invention will be described in detail with reference to the drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a semiconductor film having a heterostructure including a seed crystal layer, one of surfaces of which is in contact with an insulating surface, and an oxide semiconductor film in contact with the other surface of the seed crystal layer will be described with reference to FIGS. 1A and 1B, FIGS. 2A and 2B, FIGS. 3A to 3C, FIGS. 4A and 4B, FIGS. 5A and 5B, and FIGS. 6A and 6B. The seed crystal layer includes crystals each having a c-axis-aligned first crystal structure, and the oxide semiconductor film includes anisotropic crystals each having a c-axis-aligned second crystal structure.

<Semiconductor Film having Heterostructure>

Figure 1B:
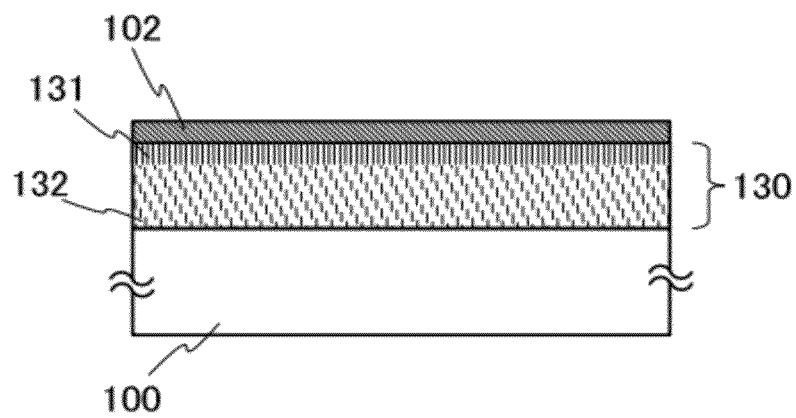

FIGS. 1A and 1B are schematic diagrams of a semiconductor film having a heterostructure described in this embodiment.

A semiconductor film 130 having a heterostructure includes a seed crystal layer 131 and an oxide semiconductor film 132. FIG 1A illustrates a mode of the semiconductor film 130 having a heterostructure in which the seed crystal layer 131 is provided to be in contact with an insulating surface 102 over a substrate 100. In addition, FIG. 1B illustrates another mode of the semiconductor film 130 having a heterostructure in which the seed crystal layer 131 is provided to be in contact with the oxide semiconductor film 132 over the substrate 100. In both the modes, the seed crystal layer 131 includes crystals each having a c-axis-aligned first crystal structure, the oxide semiconductor film 132 includes anisotropic crystals each having a c-axis-aligned second crystal structure, and the seed crystal layer 131 has higher crystallinity than the oxide semiconductor film 132.

<Hexagonal Crystal Structure>

First, a hexagonal crystal structure will be described.

Figure 2A:
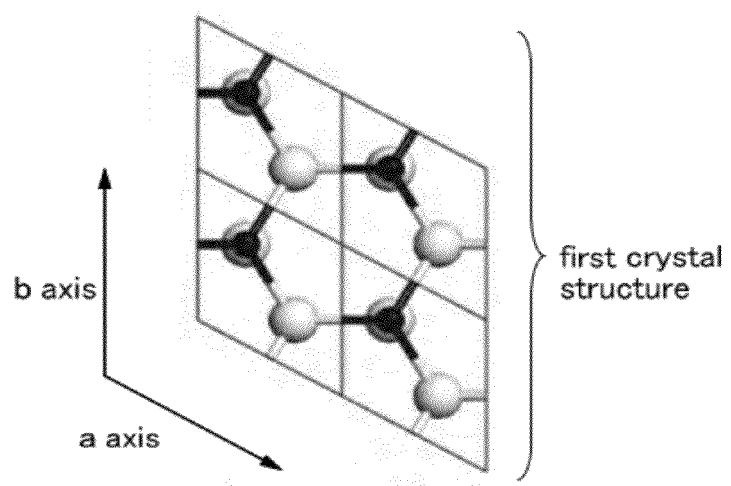
FIGS. 2A and 2B are schematic diagrams showing a first crystal structure according to an embodiment.
Figure 2B:
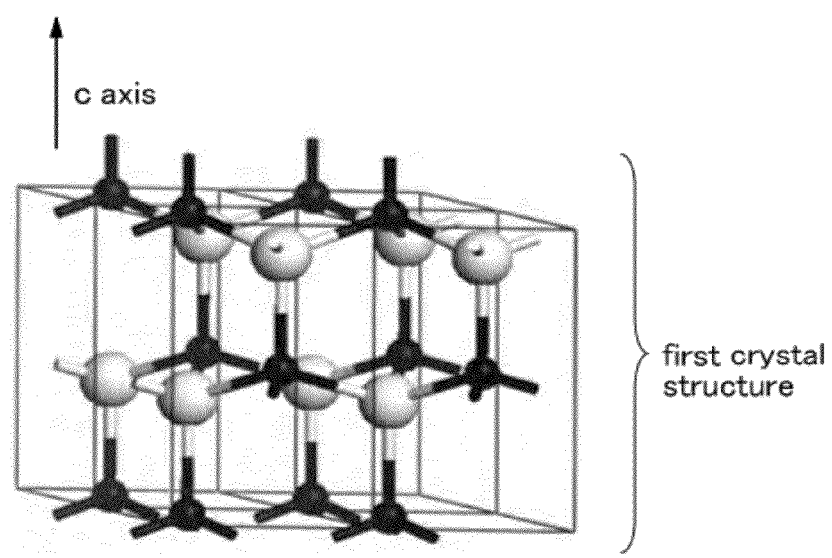

The first crystal structure is described with reference to FIGS. 2A and 2B. The first crystal structure is a wurtzite type. FIG. 2A shows a structure seen from the a-b plane in the first crystal structure, and FIG. 2B shows a structure where the c-axis direction is the vertical direction.

Examples of crystals having the first crystal structure include crystals of zinc oxide, indium nitride, and gallium nitride. Further, an oxide semiconductor containing nitrogen can be a film including crystals each having the c-axis-aligned first crystal structure in some cases.

Specifically, an In—Ga—Zn—O film containing nitrogen at a concentration higher than or equal to $5\times10^{19}/cm^3$, preferably higher than or equal to $1\times10^{20}/cm^3$, and lower than 7 at. %, becomes a film including crystals each having the c-axis-aligned first crystal structure, and in metal sites, In, Ga, and Zn are arranged in a random manner.

Next, the second crystal structure is described. The second crystal structure may be a hexagonal crystal structure other than a wurtzite type (a non-wurtzite structure) or any of a $YbFe_2O_4$ structure, a $Yb_2Fe_3O_7$ structure, and the deformed structure of the foregoing structure.

For example, an In—Ga—Zn—O film containing nitrogen at a concentration higher than or equal to $1\times10^{17}/cm^3$ and lower than $5\times10^{19}/cm^3$ becomes a film including crystals each having the c-axis-aligned hexagonal second crystal structure. The In—Ga—Zn—O film including crystals each having the c-axis-aligned hexagonal second crystal structure has In—O crystal planes (crystal planes each containing indium and oxygen) in the a-b plane and two layers containing Ga and Zn between the In—O crystal planes. Note that each of the two layers does not necessarily contain both Ga and Zn as long as Ga and Zn are collectively contained in the two layers, and there is no limitation on the position of Ga and Zn.

The first crystal structure and the second crystal structure are both hexagonal crystal structures in which atoms are arranged in a hexagonal shape in the a-b plane. Further, the crystals having the second crystal structure are in contact with the crystals having the first crystal structure, and the crystals having the second crystal structure are aligned with the crystals having the first crystal structure.

Figure 3A:
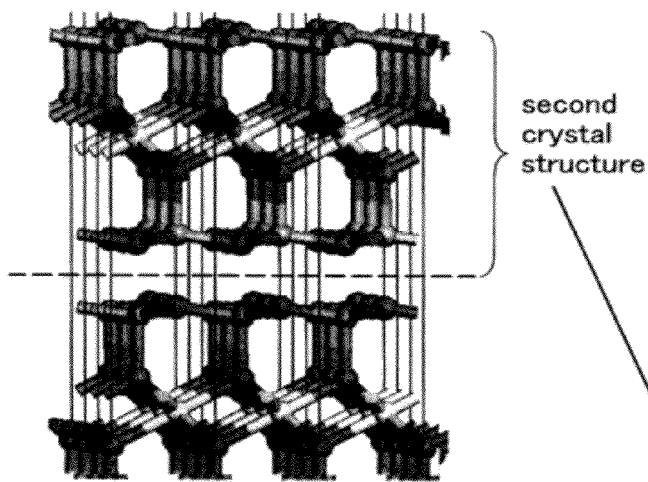
FIGS. 3A to 3C are diagrams showing a semiconductor film having a heterostructure according to an embodiment.
Figure 3C:
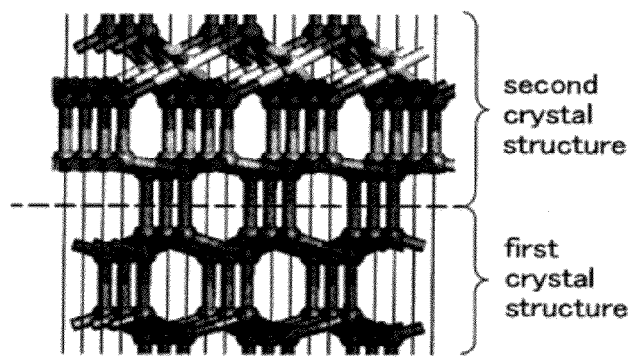
Figure 3B:
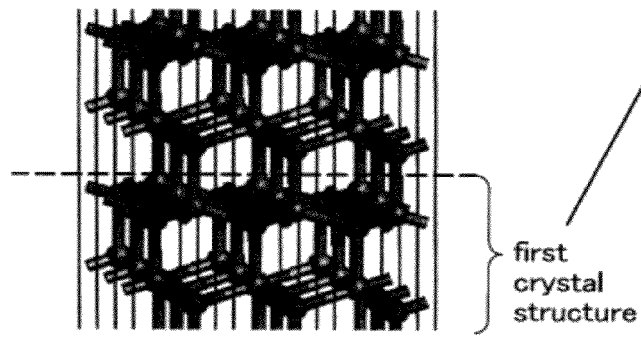

FIGS. 3A to 3C show a manner in which the crystals with the second crystal structure having the same lattice constant as the first crystal structure are aligned on the crystals with the first crystal structure. FIG. 3A shows the second crystal structure, and FIG. 3B shows the first crystal structure. In addition, FIG. 3C is a schematic view showing a manner in which the crystals with the second crystal structure are in contact with the crystals with the first crystal structure and the crystals with the second crystal structure are aligned with the crystals with the first crystal structure.

In this manner, a layer including crystals each having the c-axis-aligned first crystal structure which has high crystallinity and is easily crystallized is formed as a seed crystal layer, and then an oxide semiconductor film is formed in contact with the seed crystal layer, whereby the crystals each having the first crystal structure in the seed crystal layer facilitate crystallization of the oxide semiconductor film.

<Seed Crystal Layer>

Next, a seed crystal layer is described. The seed crystal layer includes crystals having the c-axis-aligned first crystal structure. In particular, for the seed crystal layer, a material which has higher crystallinity and can be crystallized more easily than an oxide semiconductor film is used. With use of the material which has high crystallinity and be easily crystallized, crystallinity of a region in the vicinity of a surface in contact with the insulating surface can be increased, so that an amorphous region whose electrical characteristics are unstable can be prevented from being left.

Crystal having the c-axis-aligned first crystal structure which can be applied to the seed crystal layer is described.

As examples of a compound which has the c-axis-aligned first crystal structure and can be used for the seed crystal layer, indium nitride, gallium nitride, or the like can be given. An oxide semiconductor containing nitrogen at a concentration higher than or equal to $5 \times 10^{19}/cm^3$, preferably higher than or equal to $1 \times 10^{20}/cm^3$, and lower than 7 at. %, can be a film including crystals each having the c-axis-aligned first crystal structure in some cases.

In the case of using an oxide semiconductor containing nitrogen for the seed crystal layer, nitrogen is intentionally contained so that the nitrogen concentration becomes higher than or equal to $5 \times 10^{19}/cm^3$, preferably higher than or equal to $1 \times 10^{20}/cm^3$, and lower than 7 at. %. An oxide semiconductor layer in which nitrogen is intentionally contained in this range has a smaller energy gap than an oxide semiconductor layer in which nitrogen is not intentionally contained, and thus carriers easily flow therein.

Note that a diffraction image where bright points appear alternately may be observed in an observation image of the c-axis-aligned first crystal structure, which is obtained using a high-angle annular dark field (HAADF)-STEM.

Figure 4A:
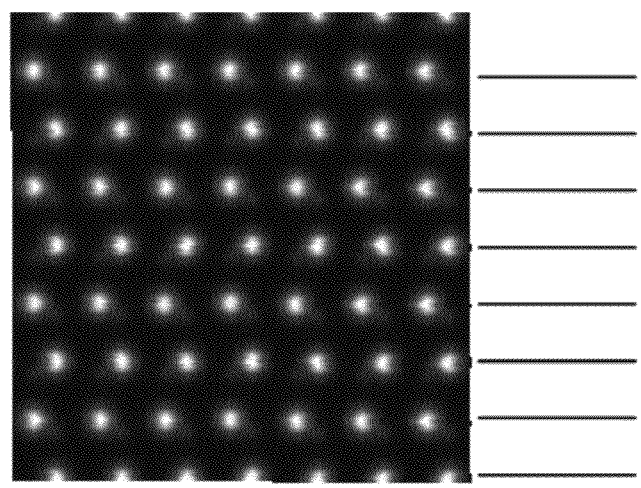
FIGS. 4A and 4B are observation images showing a crystal structure according to an embodiment, which are obtained with a HAADF-STEM.

FIG. 4A shows a HAADF-STEM observation image obtained by calculation based on the c-axis-aligned first crystal structure.

Figure 4B:
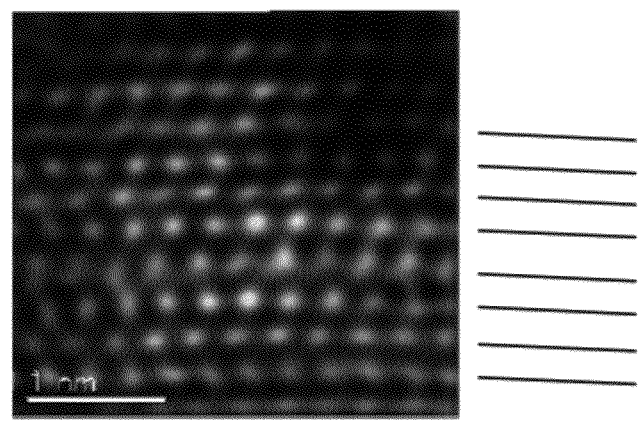

FIG. 4B shows a HAADF-STEM observation image of an In—Ga—Zn—O film formed using a deposition gas containing only nitrogen.

From each of the HAADF-STEM observation images in FIGS. 4A and 4B, it can be confirmed that the c-axis-aligned first crystal structure has a two-layer cycle structure.

Note that the In—Ga—Zn—O film containing nitrogen was formed by a sputtering method over a quartz glass substrate to a thickness of 300 nm. Deposition was performed under conditions where a target containing In, Ga, and Zn at 1:1:1 [atomic ratio] was used, the distance between the substrate and the target was 60 mm, a DC power source was used, the power was 0.5 kw, and the pressure was 0.4 Pa. In addition, the substrate temperature during deposition was 400° C., and only nitrogen was introduced as a sputtering gas into a deposition chamber at a flow rate of 40 sccm.

<Oxide Semiconductor Film>

Next, an oxide semiconductor film will be described. The oxide semiconductor film is neither single crystal nor entirely in an amorphous state. In addition, the oxide semiconductor film includes at least crystals each having the c-axis-aligned second crystal structure and being bonded to the seed crystal layer. Since the oxide semiconductor film is not entirely in an amorphous state, formation of an amorphous region whose electrical characteristics are unstable is suppressed.

An anisotropic crystal having the c-axis-aligned second crystal structure which can be applied to the oxide semiconductor film will be described.

As examples of the second crystal structure, a $YbFe_2O_4$ structure, a $Yb_2Fe_3O_7$ structure, and a deformed structure of the foregoing structures can be given. For example, In—Ga—Zn—O that is a three-component metal oxide has the second crystal structure and can be used for the oxide semiconductor film. Note that the In—Ga—Zn—O film which can be used as the oxide semiconductor film may contain nitrogen at a concentration higher than or equal to $1 \times 10^{17}/cm^3$ and lower than or equal to $5 \times 10^{19}/cm^3$.

Examples of In—Ga—Zn—O that is a three-component metal oxide include $InGaZnO_4$ having a $YbFe_2O_4$ structure and $In_2Ga_2ZnO_7$ having a $Yb_2Fe_3O_7$ structure, and the In—Ga—Zn—O can have a deformed structure of the foregoing structure, which is disclosed in the following document: M. Nakamura, N. Kimizuka, and T. Mohri, "The Phase Relations in the $In_2O_3$—$Ga_2ZnO_4$—ZnO System at 1350° C.", J. Solid State Chem., 1991, Vol. 93, pp. 298-315. Note that a layer containing Yb is denoted by an A layer and a layer containing Fe is denoted by a B layer, below. The $YbFe_2O_4$ structure is a repeated structure of ABB|ABB|ABB. As an example of a deformed structure of the $YbFe_2O_4$ structure, a repeated structure of ABBB|ABBB can be given. Further, the $Yb_2Fe_3O_7$ structure is a repeated structure of ABB|AB|ABB|AB. As an example of a deformed structure of the $Yb_2Fe_3O_7$ structure, a repeated structure of ABBB|ABB|ABBB|ABB|ABBB|ABB| can be given.

Further, as the oxide semiconductor film, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide such as an In—Zn—O film, a Sn—Zn—O film, an Al—Zn—O film, or an In—Ga—O film can be used. Further, silicon may be contained in the above oxide semiconductor film. Here, for example, an In—Ga—Zn—O film means an oxide film containing indium (In), gallium (Ga), and zinc (Zn).

In the oxide semiconductor film, crystals grow to be bonded to the seed crystal layer. Accordingly, a region in the semiconductor film having a heterostructure, which is in contact with an insulating surface, can have high crystallinity, and the interface state caused by a dangling bond can be decreased, so that a semiconductor film having a heterostructure with a favorable interface condition can be provided.

Note that a diffraction image where one bright layer appears at every three layers may be observed in an observation image of the c-axis-aligned second crystal structure, which is obtained using a high-angle annular dark field (HAADF)-STEM.

Figure 5A:
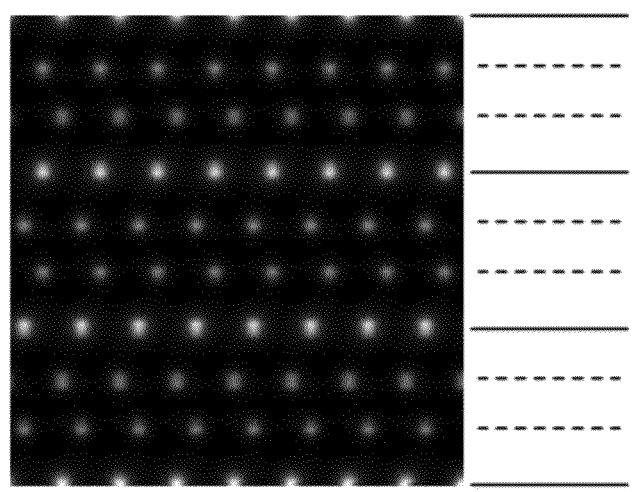
FIGS. 5A and 5B are observation images showing a crystal structure according to an embodiment, which are obtained with a HAADF-STEM.

FIG. 5A shows a HAADF-STEM observation image obtained by calculation based on the c-axis-aligned second crystal structure.

Figure 5B:
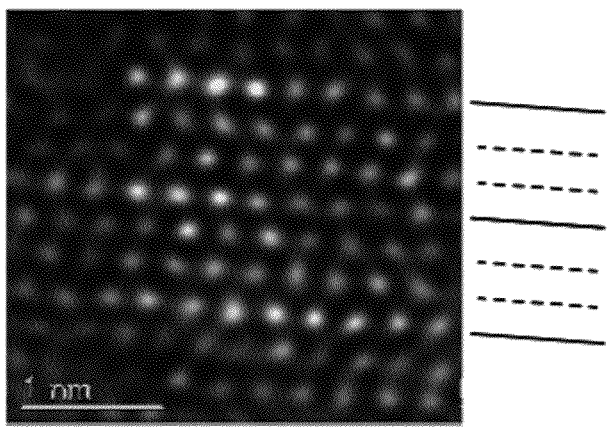

FIG. 5B shows a HAADF-STEM observation image of an In—Ga—Zn—O film.

From each of the HAADF-STEM observation images in FIGS. 5A and 5B, it can be confirmed that one bright layer appears at every three layers and that the c-axis-aligned second crystal structure has a nine-layer cycle structure.

Note that the In—Ga—Zn—O film was formed by a sputtering method over a quartz glass substrate to a thickness of 300 nm. Deposition was performed under conditions where a target containing In, Ga, and Zn at 1:1:1 [atomic ratio] was used, the distance between the substrate and the target was 60 mm, a DC power source was used, the power was 0.5 kw, and the pressure was 0.4 Pa. In addition, the substrate temperature during deposition was 400° C., and only oxygen was introduced as a sputtering gas into a deposition chamber at a flow rate of 40 sccm.

<In—Ga—Zn—O Film including Crystal having C-axis-aligned Second Crystal Structure and In—Ga—Zn—O—N Film including Crystal having C-axis-aligned First Crystal Structure>

An In—Ga—Zn—O—N film formed by using a deposition gas containing only nitrogen includes crystals each having the c-axis-aligned first crystal structure, has high crystallinity, and is suitable for the seed crystal layer. An In—Ga—

Zn—O film formed by using a deposition gas containing only oxygen includes crystals each having the c-axis-aligned second crystal structure, easily grows anisotropically, and is suitable for the oxide semiconductor film.

The degree of agreement of the lattice constants of the In—Ga—Zn—O—N film formed by using a deposition gas containing only nitrogen and the In—Ga—Zn—O film formed by using a deposition gas containing only oxygen was measured by X-ray diffraction, and the results thereof are described.

Figure 6A:
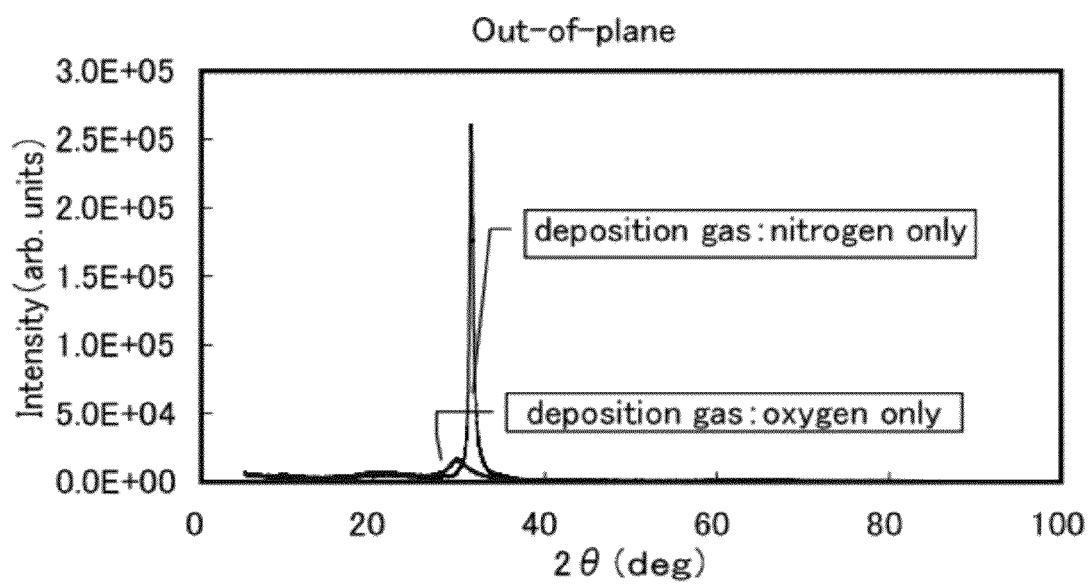
FIGS. 6A and 6B are diffraction graphs of X-ray diffraction measurement for describing a crystal structure according to an embodiment.
Figure 6B:
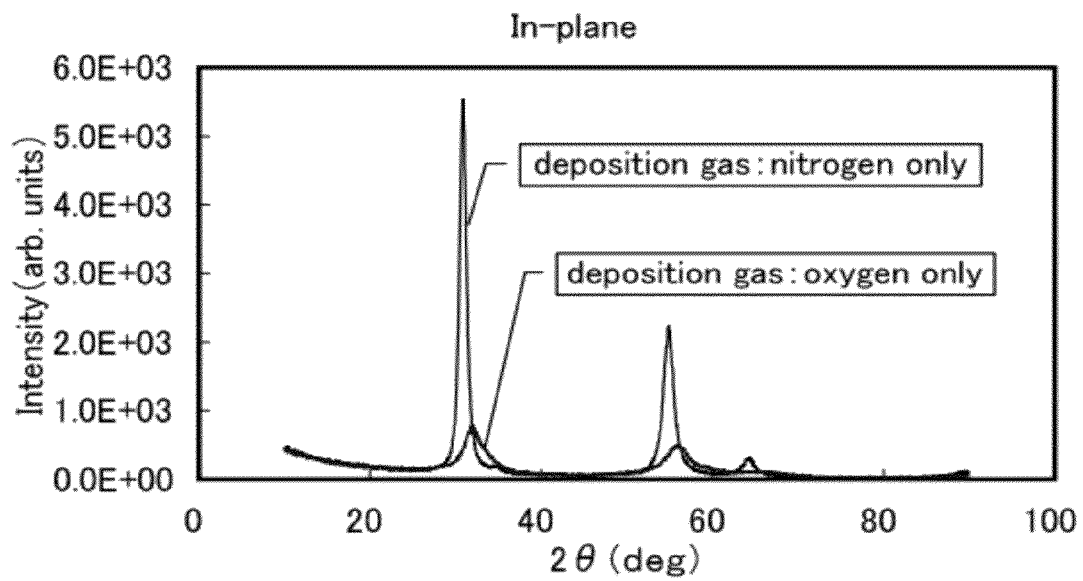

FIGS. 6A and 6B show diffraction graphs of the In—Ga—Zn—O—N film formed by using a deposition gas containing only nitrogen and the In—Ga—Zn—O film formed by using a deposition gas containing only oxygen, which were obtained by measurement with use of a 2θ method.

According to the diffraction graph in FIG. 6A obtained by an out-of-plane method, the In—Ga—Zn—O—N film formed by using a deposition gas containing only nitrogen has a sharp diffraction peak and thereby has higher crystallinity. In addition, it is found that diffraction peaks of the In—Ga—Zn—O—N film formed by using a deposition gas containing only nitrogen and the In—Ga—Zn—O film formed by using a deposition gas containing only oxygen are caused at almost the same degree. Thus, the In—Ga—Zn—O—N film formed by using a deposition gas containing only nitrogen has a hexagonal crystal structure as in the In—Ga—Zn—O film formed by using a deposition gas containing only oxygen, has a lattice constant that is close to that of the In—Ga—Zn—O film, and is suitable for the seed crystal layer.

Note that FIG. 6B shows the diffraction graph of the In—Ga—Zn—O—N film formed by using a deposition gas containing only nitrogen and the In—Ga—Zn—O film formed by using a deposition gas containing only oxygen, which was obtained by an in-plane method.

From the diffraction graph in FIG. 6B obtained by an in-plane method, it can be confirmed that in the In—Ga—Zn—O—N film formed by using a deposition gas containing only nitrogen, c-axes are aligned in a direction substantially vertical to a substrate surface having an insulating property. This result also indicates that the In—Ga—Zn—O—N film formed using a deposition gas containing only nitrogen is suitable for the seed crystal layer for the In—Ga—Zn—O film formed using a deposition gas containing only oxygen.

Note that the In—Ga—Zn—O—N film formed by using a deposition gas containing only nitrogen and the In—Ga—Zn—O film formed by using a deposition gas containing only oxygen were manufactured by the above-described method.

In the semiconductor film having a heterostructure described in this embodiment, since the seed crystal layer including crystals each having the c-axis-aligned first crystal structure is formed in contact with the insulating surface, an amorphous region whose electric characteristics are unstable is hardly formed in contact with the insulating surface. In addition, the semiconductor film having a heterostructure includes the oxide semiconductor film in which anisotropic growth of crystals each having the c-axis-aligned second crystal structure occurs from the seed crystal layer including crystals each having the c-axis-aligned crystal first crystal structure. Thus, a high crystallinity region in the semiconductor film having a heterostructure is in contact with the insulating surface, and a semiconductor film having a heterostructure in which an interface state caused by a dangling bond is decreased and a favorable interface state is provided can be provided.

This embodiment can be combined with any of the other embodiments in this specification as appropriate.

(Embodiment 2)

Figure 7A:
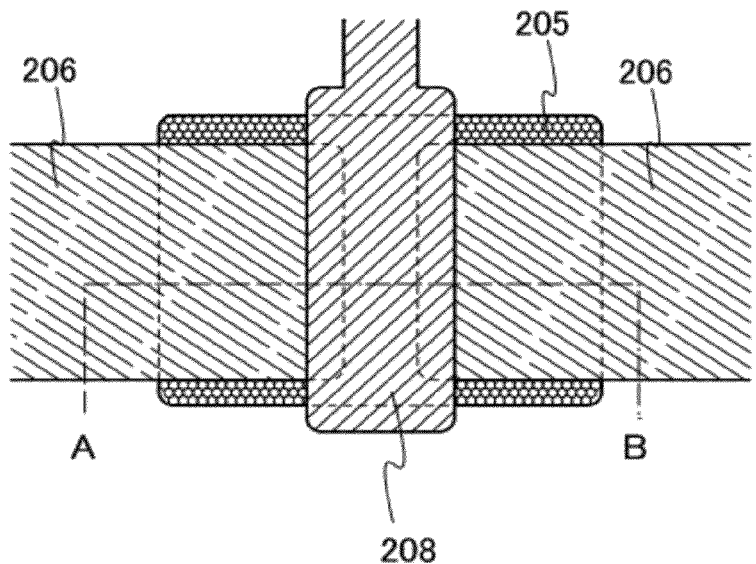
FIGS. 7A and 7B illustrate a structure of a transistor according to an embodiment.
Figure 7B:
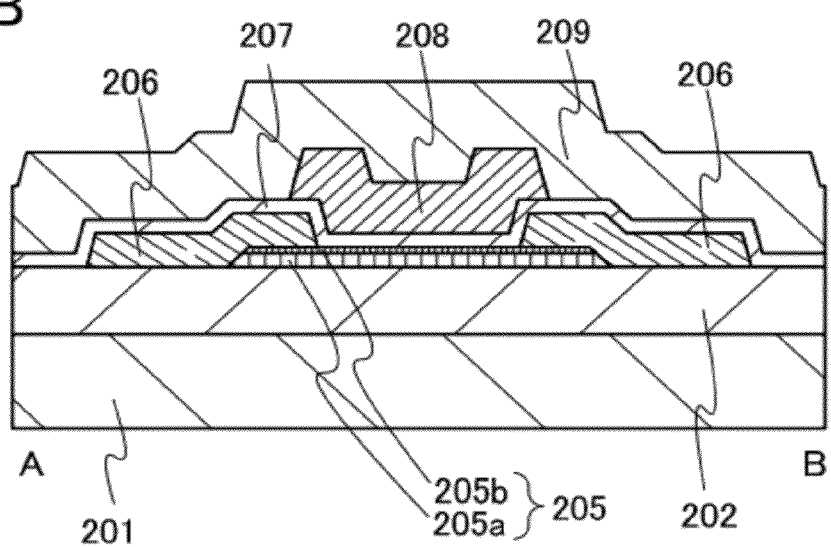
Figure 8A:
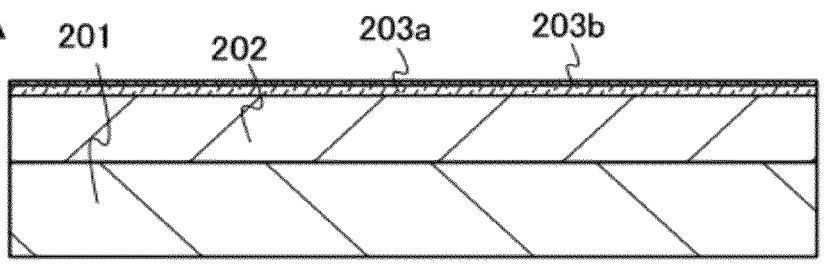
FIGS. 8A to 8C illustrate a manufacturing method of a transistor according to an embodiment.
Figure 8B:
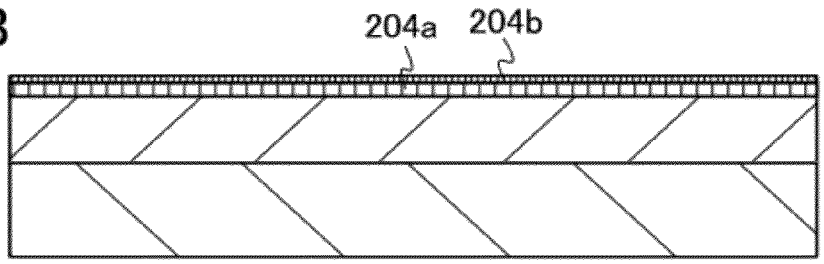
Figure 8C:
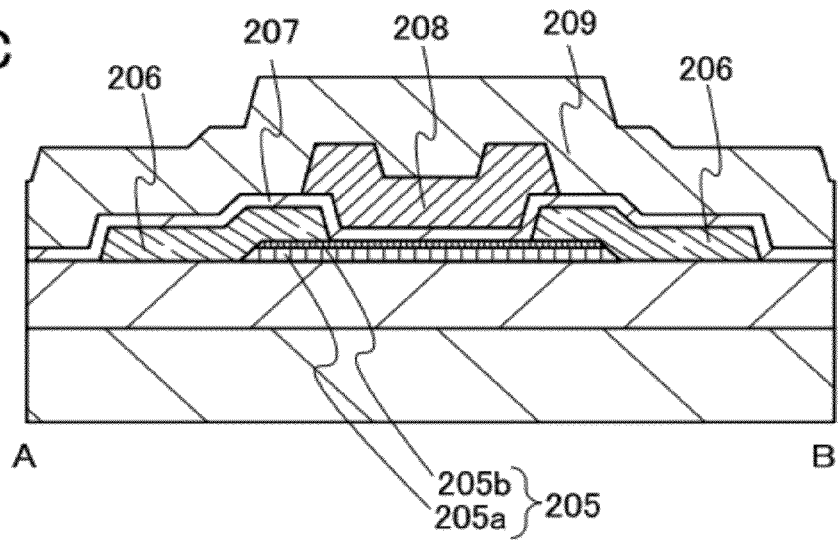

In this embodiment, a structure of a top-gate transistor in which a semiconductor film having a heterostructure is used for a channel and a manufacturing method thereof will be described with reference to FIGS. 7A and 7B and FIGS. 8A to 8C. FIG. 7B is a cross-sectional view illustrating a structure of a transistor which is one embodiment of a structure of a semiconductor element, which corresponds to a cross section along a dot-dash line A-B of FIG. 7A which is a top view. Note that in FIG. 7A, a substrate 201, an oxide insulating film 202, a gate insulating film 207, and an insulating film 209 are omitted. FIGS. 8A to 8C are cross-sectional views illustrating manufacturing steps of the transistor illustrated in FIG. 7B.

The transistor illustrated in FIG. 7B includes: the oxide insulating film 202 formed over the substrate 201; a semiconductor film 205 having a heterostructure, which is formed over the oxide insulating film 202; a pair of electrodes 206 serving as a source electrode and a drain electrode formed over the semiconductor film 205 having a heterostructure; the gate insulating film 207 formed over the oxide insulating film 202, the semiconductor film 205 having a heterostructure, and the pair of electrodes 206; and a gate electrode 208 overlapping with the semiconductor film 205 having a heterostructure with the gate insulating film 207 positioned therebetween. Further, the insulating film 209 covering the gate insulating film 207 and the gate electrode 208 may be provided.

In the semiconductor film 205 having a heterostructure, an oxide semiconductor film 205a including crystals each having a second crystal structure, which is in contact with the oxide insulating film 202, and a seed crystal layer 205b including crystals each having a first crystal structure, which is in contact with the oxide semiconductor film 205a including crystals each having the second crystal structure, are stacked.

In addition, in the oxide semiconductor film 205a, crystals each having the second crystal structure grow using the crystals each having the first crystal structure included in the seed crystal layer 205b as a seed crystal.

The crystals each having the second crystal structure included in the oxide semiconductor film 205a are hexagonal crystals which are different from a hexagonal crystal of the first crystal structure. The second crystal structure may have a homologous series.

In addition, the crystals each having the first crystal structure included in the seed crystal layer 205b are hexagonal crystals.

That is, the first crystal structure and the second crystal structure both include hexagonal crystals, and thus, a hexagonal lattice image can be observed from the c-axis direction.

Note that neither the oxide semiconductor film 205a including crystals each having the second crystal structure nor the seed crystal layer 205b including crystals each having the first crystal structure are non-single crystal. The oxide semiconductor film is not entirely in an amorphous state and includes a c-axis-aligned crystal region.

Next, a method for manufacturing the transistor illustrated in FIG. 7B is described with reference to FIGS. 8A to 8C.

As illustrated in FIG. 8A, after the oxide insulating film 202 is formed over the substrate 201, a first oxide semiconductor film 203a is formed over the oxide insulating film 202, and a second oxide semiconductor film 203b which becomes the seed crystal layer later is formed over the first oxide semiconductor film 203a.

It is necessary that the substrate 201 have at least heat resistance high enough to withstand heat treatment to be performed later. When a glass substrate is used as the substrate 201, a glass substrate whose strain point is higher than or equal to 730° C. is preferably used. As the glass substrate, a glass material such as aluminosilicate glass, aluminoborosilicate glass, or barium borosilicate glass is used, for example. Note that a glass substrate containing BaO and $B_2O_3$ so that the amount of BaO is larger than that of $B_2O_3$ is preferably used. In the mass production, a mother glass with the following size is preferably used for the substrate 201: the 8-th generation (2160 mm×2460 mm); the 9-th generation (2400 mm×2800 mm, or 2450 mm×3050 mm); the 10-th generation (2950 mm×3400 mm); or the like. The mother glass drastically shrinks when the treatment temperature is high and the treatment time is long. Thus, in the case where mass production is performed with use of the mother glass, the preferable heating temperature in the manufacturing process is lower than or equal to 600° C., further preferably, lower than or equal to 450° C.

Instead of the glass substrate, a substrate formed of an insulator, such as a ceramic substrate, a quartz substrate, or a sapphire substrate can be used. Alternatively, crystallized glass or the like may be used. Further alternatively, a substrate obtained by forming an insulating film over a surface of a semiconductor substrate such as a silicon wafer or a conductive substrate made of a metal material can be used.

Note that in the case where a glass substrate including an impurity such as an alkali metal is used as the substrate 201, a nitride insulating film such as a silicon nitride film or an aluminum nitride film may be formed between the substrate 201 and the oxide insulating film 202 in order to prevent entry of an alkali metal. The nitride insulating film can be formed by a CVD method, a sputtering method, or the like. Since an alkali metal such as lithium, sodium, or potassium becomes an impurity in the oxide semiconductor film formed later, the contained amount of such an alkali metal is preferably small.

The oxide insulating film 202 is formed using an oxide insulating film from which part of contained oxygen is released by heat treatment. The oxide insulating film from which part of contained oxygen is released by heat treatment is preferably an oxide insulating film which contains oxygen whose amount exceeds that of the stoichiometry. Oxygen can be diffused to the first oxide semiconductor film 203a and the second oxide semiconductor film 203b by the heat treatment from the oxide insulating film from which part of contained oxygen is released by heat treatment. Typical examples of the oxide insulating film 202 include films of silicon oxide, silicon oxynitride, silicon nitride oxide, aluminum oxide, aluminum oxynitride, gallium oxide, hafnium oxide, yttrium oxide, and the like.

Part of contained oxygen in the oxide insulating film which contains oxygen whose amount exceeds that of the stoichiometry is released by heat treatment. The released amount of oxygen at this time is greater than or equal to $1\times10^{18}$ atoms/$cm^3$, preferably greater than or equal to $1\times10^{20}$ atoms/$cm^3$, further preferably greater than or equal to $3\times10^{20}$ atoms/$cm^3$ in thermal desorption spectroscopy (TDS) on an oxygen atom basis.

Here, a method in which the amount of released oxygen is measured on an oxygen atom basis using TDS analysis will be described.

The amount of released gas in TDS analysis is proportional to the integral value of a spectrum. Therefore, the amount of released gas can be calculated from the ratio between the integral value of a spectrum of an oxide insulating film and the reference value of a standard sample. The reference value of a standard sample refers to the ratio of the density of a predetermined atom contained in a sample to the integral value of a spectrum.

For example, the number of the released oxygen molecules ($N_{(O2)}$) from an oxide insulating film can be found according to a Numerical Expression 1 with the TDS analysis results of a silicon wafer containing hydrogen at a predetermined density which is the standard sample and the TDS analysis results of the oxide insulating film. Here, all spectra having a mass number of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{(O2)} = N_{(H2)}/S_{(H2)} \times S_{(O2)} \times \alpha \qquad \text{(Numerical Expression 1)}$$

$N_{(H2)}$ is the value obtained by conversion of the number of hydrogen molecules released from the standard sample into densities. $S_{(H2)}$ is an integral value of spectrum of a standard sample which is analyzed by TDS. Here, the reference value of the standard sample is set to $N_{(H2)}/S_{(H2)}$. $S_{(O2)}$ is an integral value of spectrum when the oxide insulating film is analyzed by TDS. $\alpha$ is a coefficient affecting the intensity of the spectrum in the TDS analysis. Refer to Japanese Published Patent Application No. H6-275697 for details of the Numerical Expression 1. Note that the amount of released oxygen from the above oxide insulating film is measured with a thermal desorption spectroscopy apparatus produced by ESCO Ltd., EMD-WA1000S/W using a silicon wafer containing hydrogen atoms at $1\times10^{16}$ atoms/$cm^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above α includes the ionization rate of the oxygen molecules, the number of the released oxygen atoms can also be estimated through the evaluation of the number of the released oxygen molecules.

Note that $N_{(O2)}$ is the number of the released oxygen molecules. For the oxide insulating film, the amount of released oxygen on an oxygen atom basis is twice the number of the released oxygen molecules.

The oxide insulating film 202 has a thickness greater than or equal to 50 nm, preferably greater than or equal to 200 nm and less than or equal to 500 nm. With use of the thick oxide insulating film 202, the amount of oxygen released from the oxide insulating film 202 can be increased, and defects at the interface between the oxide insulating film 202 and an oxide semiconductor film to be formed later can be reduced, which can be achieved by an increase in the thickness.

The oxide insulating film 202 is formed by a sputtering method, a CVD method or the like. Preferably, the oxide insulating film from which part of contained oxygen is released by heat treatment is easily formed by a sputtering method.

When the oxide insulating film from which part of contained oxygen is released by heat treatment is formed by a sputtering method, the amount of oxygen contained in a deposition gas is preferably large, and oxygen, a mixed gas in oxygen and a rare gas, or the like can be used. Typically, the oxygen concentration of a deposition gas is preferably from 6% to 100%.

The first oxide semiconductor film 203a is formed using an oxide semiconductor film which can include a hexagonal crystal and have a second crystal structure by heat treatment.

As the first oxide semiconductor film 203a, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide such as an In—Zn—O film, a Sn—Zn—O film, an Al—Zn—O film, or an In—Ga—O film can be used. Further, $SiO_2$ may be contained in the above oxide semiconductor. Here, for example, an In—Ga—Zn—O film refers to an oxide film containing indium (In), gallium (Ga), and zinc (Zn).

Preferably, the energy gap of the metal oxide which can form the first oxide semiconductor film 203a is 2 eV or more, preferably 2.5 eV or more, further preferably 3 eV or more. In this manner, off-state current of a transistor can be reduced by using an oxide semiconductor having an energy gap.

The second oxide semiconductor film 203b is formed using an oxide semiconductor film which can have the first crystal structure, by heating. The oxide semiconductor film which can have the first crystal structure is crystallized more easily by heat treatment and has higher crystallinity than the oxide semiconductor film which can have the second crystal structure.

For the second oxide semiconductor film 203b, zinc oxide, an oxynitride semiconductor, or the like can be used. The oxynitride semiconductor can be formed by adding nitrogen at $5\times10^{19}/cm^3$, preferably higher than or equal to $1\times10^{20}/cm^3$, and lower than 7 at. % to the metal oxide as for the first oxide semiconductor film 203a.

The second oxide semiconductor film 203b is used as a seed crystal for crystal growth of the first oxide semiconductor film 203a. Therefore, the second oxide semiconductor film 203b may have a thickness with which crystal growth occurs, typically greater than or equal to a thickness of one atomic layer and less than or equal to 10 nm, preferably greater than or equal to 2 nm to less than or equal to 5 nm. When the second oxide semiconductor film 203b is thin, throughput in deposition treatment and heat treatment can be improved.

The first oxide semiconductor film 203a and the second oxide semiconductor film 203b can be each formed by a sputtering method, a coating method, a printing method, a pulsed laser deposition method, or the like. When the first oxide semiconductor film 203a and the second oxide semiconductor film 203b are formed by a sputtering method, one of an AC sputtering apparatus, a DC sputtering apparatus, and an RF sputtering apparatus is used.

Note that in the case where the second oxide semiconductor film 203b is formed using an oxynitride semiconductor by a sputtering method, after the first oxide semiconductor film 203a is formed, the kind of gas introduced into a sputtering apparatus is changed, i.e., nitrogen is introduced, so that an oxynitride semiconductor can be formed. That is, the first oxide semiconductor film 203a and the second oxide semiconductor film 203b can be formed successively, which results in high mass production.

Next, first heat treatment is performed. The temperature of the first heat treatment is higher than or equal to 150° C. and lower than or equal to 650° C., preferably higher than or equal to 200° C. and lower than or equal to 500° C. In addition, heating time of the first heat treatment is longer than or equal to 1 minute and shorter than or equal to 24 hours. After the temperature of the first heat treatment is gradually increased, the temperature may be set constant. When the speed for increasing the temperature from a temperature of higher than or equal to 500° C. is 0.5° C./h to 3° C./h inclusive, crystal growth of the second oxide semiconductor film 203b is gradually carried out; thus, the crystallinity can be further enhanced.

The first heat treatment is preferably performed in a rare gas (typically, argon) atmosphere, an oxygen atmosphere, a nitrogen atmosphere, a dry air atmosphere, an atmosphere containing a rare gas (typically, argon) and oxygen, or an atmosphere containing a rare gas and nitrogen. Specifically, a high-purity gas atmosphere is preferably used, in which the concentration of impurities such as hydrogen are reduced to several ppm or several ppb.

A heat treatment apparatus used for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

By the first heat treatment, crystal growth starts from a surface of the second oxide semiconductor film 203b toward the first oxide semiconductor film 203a. Since the second oxide semiconductor film 203b is easily crystallized, the second oxide semiconductor film 203b is entirely crystallized, so that a seed crystal layer 204b including crystals each having a first crystal structure is provided. Further, since the crystal growth proceeds from the surface of the second oxide semiconductor film 203b toward the first oxide semiconductor film 203a, a crystal region with c-axis alignment is formed. That is, in the a-b plane of the crystals each having the first crystal structure included in the seed crystal layer 204b, atoms are bonded to form a hexagonal shape. In addition, layers in each of which atoms are bonded to form a hexagonal shape are stacked and bonded in the film thickness direction (the c-axis direction); thus, c-axis alignment is formed.

By performing the first heat treatment continuously, crystal growth of the first oxide semiconductor film 203a proceeds from an interface with the seed crystal layer 204b toward the oxide insulating film 202, using the crystals each having the first crystal structure included in the seed crystal layer 204b as a seed. Since the crystals each having the first crystal structure included in the seed crystal layer 204b have c-axis alignment, by using the crystals each having the first crystal structure included in the seed crystal layer 204b as a seed, crystals can grow in the first oxide semiconductor film 203a so as to substantially align with the crystal axis of the crystals each having the first crystal structure included in the seed crystal layer 204b. That is, crystal growth can be carried out while c-axes in the first oxide semiconductor film 203a are aligned. That is, atoms are bonded to form a hexagonal shape in the a-b plane of crystals each having the second crystal structure included in an oxide semiconductor film 204a including which can be obtained by crystal growth of the first oxide semiconductor film 203a. Further, layers in each of which bonds are formed to have a hexagonal shape are stacked and bonded in the film thickness direction (the c-axis direction); thus, c-axis alignment is formed. Through the above steps, the oxide semiconductor film 204a including crystals each having the c-axis-aligned second crystal structure can be formed (see FIG. 8B).

Note that when crystal growth proceeds in the vertical direction from the surface of the second oxide semiconductor film 203b by the first heat treatment, c-axes in the oxide semiconductor film 204a including crystals each having the second crystal structure and the seed crystal layer 204b including crystals each having the first crystal structure are in the direction substantially vertical to the surface.

In addition, by the first heat treatment, hydrogen contained in the first oxide semiconductor film 203a and the second oxide semiconductor film 203b is released and part of contained oxygen in the oxide insulating film 202 diffuses into the first oxide semiconductor film 203a, the second oxide semiconductor film 203b, and the vicinity of the interface between the oxide insulating film 202 and the first oxide semiconductor film 203a. By this step, oxygen defects included in the first oxide semiconductor film 203a and the second oxide semiconductor film 203b can be reduced, and oxygen can diffuse to a region in the oxide insulating film 202, which is in the vicinity of the interface with the first oxide semiconductor film 203a, so that defects at the interface between the oxide insulating film 202 and the first oxide semiconductor film 203a can be reduced. As a result, the oxide semiconductor film 204a including crystals each having the second crystal structure and the seed crystal layer 204b including crystals each having the first crystal structure, in each of which the hydrogen concentration and oxygen defects are reduced, can be formed.

Note that when the first oxide semiconductor film 203a and the second oxide semiconductor film 203b are formed by a sputtering method, the leakage rate of a treatment chamber of a sputtering apparatus is set to $1 \times 10^{-10}$ Pa·m$^3$ or lower, so that entry of impurities such as alkali metal and hydrogen into the first oxide semiconductor film 203a and the second oxide semiconductor film 203b during the deposition by the sputtering method can be suppressed. Further, with use of an entrapment vacuum pump (e.g., a cryopump) as an evacuation system, counter flow of impurities such as an alkali metal or hydrogen from the evacuation system can be reduced.

Further, when the first oxide semiconductor film 203a and the second oxide semiconductor film 203b are formed, a gas introduced into the treatment chamber of the sputtering apparatus, e.g., a nitrogen gas, an oxygen gas, an argon gas, or the like, which is heated, may be introduced and deposition may be performed. As a result, the content of hydrogen contained in the first oxide semiconductor film 203a and the second oxide semiconductor film 203b can be reduced.

Before the first oxide semiconductor film 203a and the second oxide semiconductor film 203b are formed by a sputtering method, preheat treatment may be performed in order to remove moisture or hydrogen included in a surface or the inside of a sputtering apparatus or a target. As a result, the content of hydrogen contained included in the first oxide semiconductor film 203a and the second oxide semiconductor film 203b can be reduced.

Through the above steps, the oxide semiconductor film 204a including crystals each having the second crystal structure and the seed crystal layer 204b including crystals each having the first crystal structure can be formed. In other words, a semiconductor film having a heterostructure can be formed. In addition, the hydrogen concentration and oxygen defects in the oxide semiconductor film 204a including crystals each having the second crystal structure and the seed crystal layer 204b including crystals each having the first crystal structure can be reduced. By a bond of an oxide semiconductor and hydrogen, part of contained hydrogen serves as a donor to generate electrons as carriers. In addition, oxygen defects in the oxide semiconductor also serve as donors to generate electrons as carriers. Thus, the hydrogen concentration and the oxygen defects in the oxide semiconductor film 204a including crystals each having the second crystal structure and the seed crystal layer 204b including crystals each having the first crystal structure are reduced, whereby the negative shift of the threshold voltage of a transistor manufactured later can be reduced.

Next, a mask is formed over the seed crystal layer 204b including crystals each having the first crystal structure, and then the oxide semiconductor film 204a including crystals each having the second crystal structure and the seed crystal layer 204b including crystals each having the first crystal structure are selectively etched with use of the mask, so that the oxide semiconductor film 205a including crystals each having the second crystal structure and the seed crystal layer 205b including crystals each having the first crystal structure are formed. Note that the oxide semiconductor film 205a including crystals each having the second crystal structure and the seed crystal layer 205b including crystals each having the first crystal structure are collectively referred to as the semiconductor film 205 having a heterostructure. After that, the mask is removed.

The mask used for etching the oxide semiconductor film 204a including crystals each having the second crystal structure and the seed crystal layer 204b including crystals each having the first crystal structure can be formed by a photolithography method, an inkjet method, a printing method, or the like as appropriate. As the etching of the oxide semiconductor film 204a including crystals each having the second crystal structure and the seed crystal layer 204b including crystals each having the first crystal structure, either wet etching or dry etching can be employed as appropriate.

Next, a pair of electrodes 206 is formed to be in contact with the semiconductor film 205 having a heterostructure. Then, the gate insulating film 207 is formed over the oxide insulating film 202, the semiconductor film 205 having a heterostructure, and the pair of electrodes 206. Next, a gate electrode 208 is formed over the gate insulating film 207. In addition, the insulating film 209 may be formed over the gate insulating film 207 and the gate electrode 208 (see FIG. 8C).

The pair of electrodes 206 serves as a source electrode and a drain electrode.

The pair of electrodes 206 can be formed using a metal element selected from aluminum, chromium, copper, tantalum, titanium, molybdenum, or tungsten; an alloy containing any of these metal elements as a component; an alloy containing these metal elements in combination; and the like. Further, one or more metal elements selected from manganese, magnesium, zirconium, and beryllium may be used. In addition, the pair of electrodes 206 can have a single-layer structure or a stacked structure having two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used. Note that in the case where copper is used as one of materials for the pair of electrodes 206, a stacked structure in which a copper-magnesium-aluminum alloy layer is provided to be in contact with the semiconductor film 205 having a heterostructure and a copper layer is provided to be in contact with the copper-magnesium-aluminum alloy layer.

The pair of electrodes 206 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The pair of electrodes 206 is formed by a printing method or an inkjet method. Alternatively, after a conductive film is formed by a sputtering method, a CVD method, an evaporation method or the like, a mask is formed over the conductive film and the conductive film is etched, and thereby the pair of electrodes 206 is formed. The mask formed over the conductive film can be formed by an inkjet method, a printing method, a photolithography method, or the like as appropriate.

Note that a conductive film is formed over the seed crystal layer 204b including crystals each having the first crystal structure, and then a concavo-convex shaped mask is formed with use of a multi-tone photo-mask. With use of the mask, the oxide semiconductor film 204a including crystals each having the second crystal structure, the seed crystal layer 204b including crystals each having the first crystal structure, and the conductive film are etched. Then, the concavo-convex shaped mask is divided by ashing, and the conductive film is etched selectively with use of the separated masks to form the semiconductor film 205 having a heterostructure and the pair of electrodes 206. By the above steps, the number of the photomasks used and the number of steps in the photolithography process can be reduced.

The gate insulating film 207 can be formed with a single layer of a silicon oxide film, a silicon oxynitride film, a silicon nitride film, a silicon nitride oxide film, an aluminum oxide film, an aluminum oxynitride film, or a gallium oxide film or a stacked layer including any of these. It is preferable that a portion in the gate insulating film 207 which is in contact with the semiconductor film 205 having a heterostructure contain oxygen. It is further preferable that the gate insulating film 207 be formed using an oxide insulating film from which oxygen is released by heating, which is similar to the oxide insulating film 202. By using the silicon oxide film, it is possible to diffuse oxygen to the semiconductor film 205 having a heterostructure, so that its characteristics can be improved.

The gate insulating film 207 is formed using a high-k material film such as a hafnium silicate (HfSiO$_x$) film, a hafnium silicate film to which nitrogen is added (HfSi$_x$O$_y$N$_z$), a hafnium aluminate film to which nitrogen is added (HfAl$_x$O$_y$N$_z$), a hafnium oxide film, or a yttrium oxide film, so that gate leakage current can be reduced. Further, a stacked structure can be used in which a high-k material film and one or more of a silicon oxide film, a silicon nitride film, a silicon oxynitride film, a silicon nitride oxide film, an aluminum oxide film, an aluminum oxynitride film, and a gallium oxide film are stacked. For example, the thickness of the gate insulating film 207 is preferably greater than or equal to 1 nm and less than or equal to 300 nm, and further preferably greater than or equal to 5 nm and less than or equal to 50 nm.

The gate insulating film 207 is formed by a sputtering method, a CVD method, or the like.

Note that before the gate insulating film 207 is formed, a surface of the semiconductor film 205 having a heterostructure is exposed to plasma of an oxidative gas such as oxygen, ozone or dinitrogen monoxide so as to be oxidized, thereby reducing the oxygen defects.

The gate electrode 208 can be formed using a metal element selected from aluminum, chromium, copper, tantalum, titanium, molybdenum, or tungsten; an alloy containing any of these metal elements as a component; an alloy containing these metal elements in combination; or the like. Further, one or more metal elements selected from manganese, magnesium, zirconium, and beryllium may be used. Further, the gate electrode 208 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, or scandium, may be used.

The gate electrode 208 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As a material layer in contact with the gate insulating layer, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, a metal nitride film (InN, ZnN, or the like) is preferably provided between the gate electrode 208 and the gate insulating film. These films each have a work function of 5 eV or higher, preferably 5.5 eV or higher; thus, the threshold voltage of the electrical characteristics of the transistor can be positive. Accordingly, a so-called normally-off switching element can be obtained. For example, in the case of using an In—Ga—Zn—O film containing nitrogen, an In—Ga—Zn—O film having a nitrogen concentration higher than at least the oxide semiconductor film 203b, or specifically, an In—Ga—Zn—O film having a nitrogen concentration of 7 at. % or higher is used.

The gate electrode 208 is formed by a printing method or an inkjet method. Alternatively, after a conductive film is formed by a sputtering method, a CVD method, an evaporation method or the like, a mask is formed over the conductive film and the conductive film is etched, and thereby the gate electrode 208 is formed. The mask formed over the conductive film can be formed by an inkjet method, a printing method, a photolithography method, or the like as appropriate.

The insulating film 209 can be formed as appropriate with any of the insulating films listed for the gate insulating film 207. When a silicon nitride film is formed as the insulating film 209 by a sputtering method, entry of moisture and an alkali metal from the outside can be prevented, and thus the amount of impurities contained in the semiconductor film 205 having a heterostructure can be reduced.

After the gate insulating film 207 or the insulating film 209 is formed, heat treatment (the temperature range is from 150° C. to 650° C., preferably 200° C. to 500° C.) may be performed in an atmosphere which hardly contains hydrogen and moisture, such as a nitrogen atmosphere, an oxygen atmosphere, or a dry air atmosphere, (e.g., as for moisture, the dew point is lower than or equal to −40° C., preferably lower than or equal to −60° C.)).

Through the above steps, a transistor in which a semiconductor film having a heterostructure in which atoms are bonded to form a hexagonal shape in the a-b plane and c-axis alignment is formed is used for a channel can be manufactured.

The semiconductor film having a heterostructure described in this embodiment has high crystallinity and high uniformity in a region which is in the vicinity of an interface between the semiconductor film and the gate insulating film. Thus, a transistor with stable electric characteristics and high reliability can be obtained. Further, by using a semiconductor film having a heterostructure, which includes atoms bonded to form a hexagonal shape in the a-b plane and a c-axis alignment, for a channel region of a transistor, the amount of change in the threshold voltage of the transistor between before and after light irradiation or a bias-temperature (BT) test performed on the transistor is small, and the transistor can have stable electric characteristics.

(Embodiment 3)

Figure 9A:
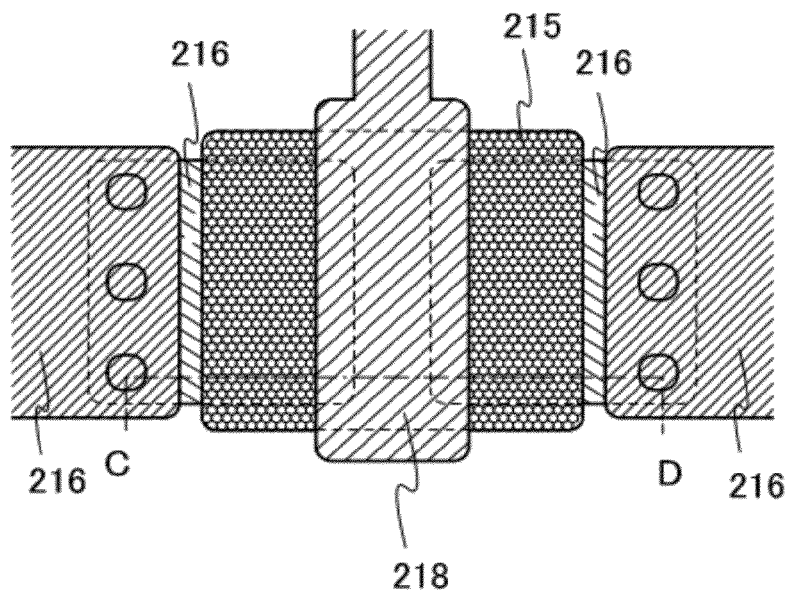
FIGS. 9A and 9B illustrate a structure of a transistor according to an embodiment.
Figure 9B:
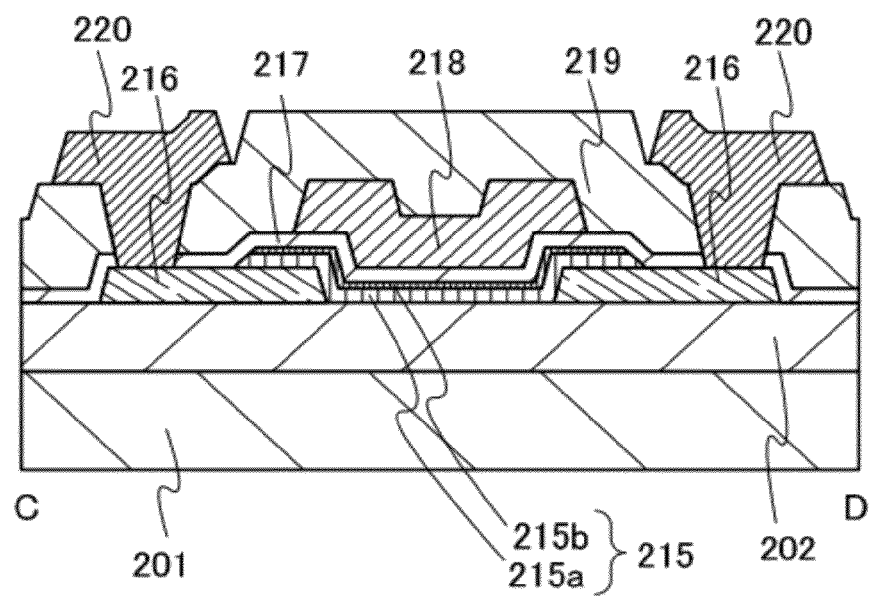
Figure 10A:
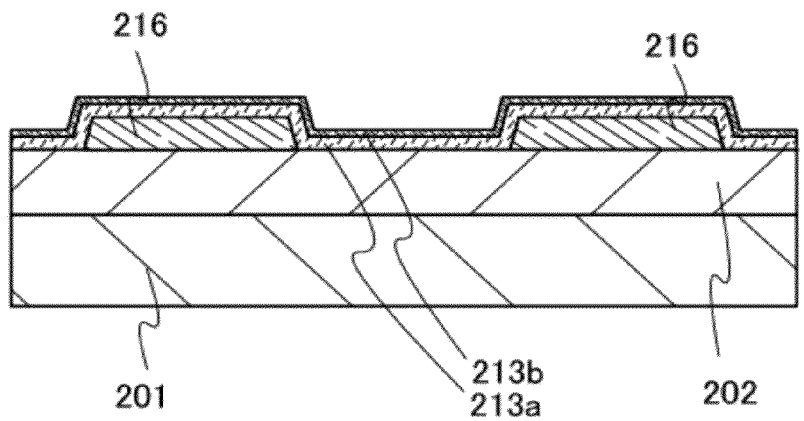
FIGS. 10A to 10C illustrate a manufacturing method of a transistor according to an embodiment.
Figure 10B:
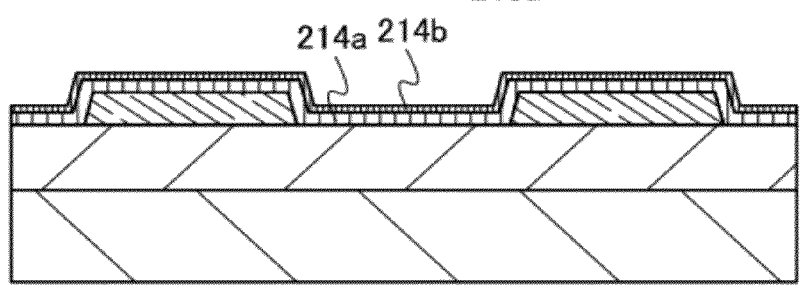
Figure 10C:
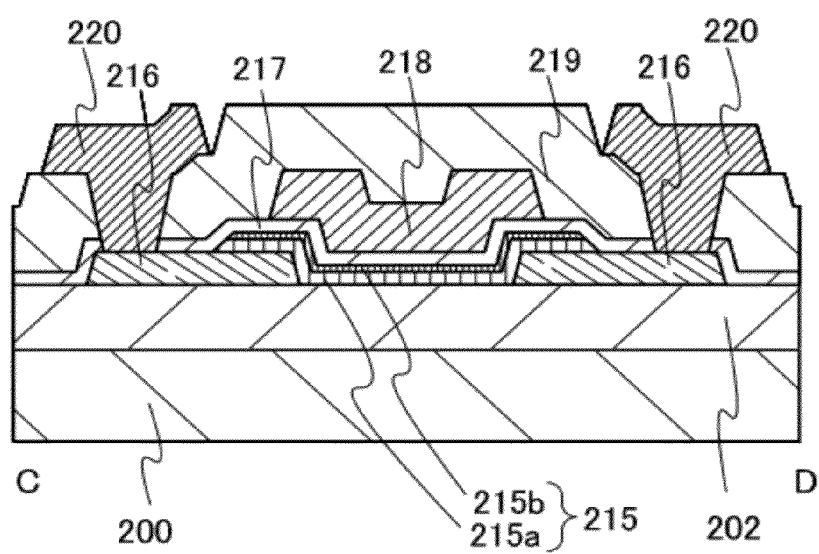

In this embodiment, a structure of a top-gate transistor different from that in Embodiment 2 and a manufacturing method thereof will be described with reference to FIGS. 9A and 9B and FIGS. 10A to 10C. In this embodiment, a pair of electrodes is provided between an oxide insulating film and a semiconductor film having a heterostructure, which is different from Embodiment 2. Note that FIG. 9A is a top view, and FIG. 9B is a cross-sectional view along a dot-dash line C-D of FIG. 9A. In FIG. 9A, the substrate 201, the oxide insulating film 202, a gate insulating film 217, and an insulating film 219 are omitted. FIGS. 10A to 10C are cross-sectional views illustrating manufacturing steps of the transistor illustrated in FIG. 9B.

The transistor illustrated in FIG. 9B includes: the oxide insulating film 202 formed over the substrate 201; a pair of electrodes 216 serving as a source electrode and a drain electrode formed over the oxide insulating film 202; a semiconductor film 215 having a heterostructure which covers the oxide insulating film 202 and the pair of electrodes 216 serving a source electrode and a drain electrode; the gate insulating film 217 formed over the oxide insulating film 202, the pair of electrodes 216, and the semiconductor film 215 having a heterostructure; and a gate electrode 218 overlapping with the semiconductor film 215 having a heterostructure with the gate insulating film 217 positioned therebetween. Further, an insulating film 219 may be provided so as to cover the gate insulating film 217 and the gate electrode 218. Furthermore, a pair of wirings 220 in contact with the pair of electrodes 216 through opening portions in the insulating film 219 may be provided.

The semiconductor film 215 having a heterostructure has a structure in which an oxide semiconductor film 215a including crystals each having a second crystal structure, which is in contact with the oxide insulating film 202 and the pair of electrodes 216, and a seed crystal layer 215b including crystals each having a first crystal structure, which is in contact with the oxide semiconductor film 215a including crystals each having the second crystal structure, are stacked.

The crystals each having the second crystal structure grow in the oxide semiconductor film 215a with use of the crystals each having the first crystal structure included in the seed crystal layer 215b including as a seed crystal.

The crystals each having the second crystal structure included in the oxide semiconductor film 215a are hexagonal crystals which are different from a hexagonal crystal of the first crystal structure. The second crystal may have a homologous series.

As in Embodiment 2, the seed crystal layer including crystals each having the first crystal structure and the oxide semiconductor film including crystals each having the second crystal structure have hexagonal crystal structures; therefore, a hexagonal lattice image can be observed from the c-axis direction.

Note that each of the oxide semiconductor film 215a including crystals each having the second crystal structure and the seed crystal layer 215b including crystals each having the first crystal structure is neither single crystal nor entirely in an amorphous state, and includes a c-axis-aligned crystal region.

Next, a method for manufacturing the transistor illustrated in FIG. 9B is described with reference to FIGS. 10A to 10C.

As illustrated in FIG. 10A, the oxide insulating film 202 is formed over the substrate 201 as in Embodiment 2. Then, the pair of electrodes 216 is formed over the oxide insulating film 202. A first oxide semiconductor film 213a and a second oxide semiconductor film 213b which becomes a seed crystal layer later are formed over the pair of electrodes 216 and the oxide insulating film 202.

The pair of electrodes 216 can be formed as appropriate by using a material and a formation method which are similar to those of the pair of electrodes 206 described in Embodiment 2.

The first oxide semiconductor film 213a and the second oxide semiconductor film 213b can be formed as appropriate by using materials and formation methods which are similar to those of the first oxide semiconductor film 203a and the second oxide semiconductor film 203b described in Embodiment 2.

Next, in a manner similar to that in Embodiment 2, first heat treatment is performed. The first heat treatment allows crystal growth to begin from a surface of the second oxide semiconductor film 213b toward the first oxide semiconductor film 213a, so that the second oxide semiconductor film 213b becomes a seed crystal layer 214b including crystals each having a first crystal structure. The seed crystal layer 214b including crystals each having the first crystal structure includes c-axis-aligned crystals.

When the first heat treatment is continued, crystal growth of the first oxide semiconductor film 213a proceeds from the interface with the seed crystal layer 214b toward the oxide insulating film 202 with use of the crystals each having the first crystal structure included in the seed crystal layer 214b as a seed, so that crystals each having a second crystal structure are formed in an oxide semiconductor film 214a including. The oxide semiconductor film 214a including crystals each having the second crystal structure includes c-axis-aligned crystals (see FIG. 10B).

Through the above steps, the oxide semiconductor film 214a including crystals each having the second crystal structure and the seed crystal layer 214b including crystals each having the first crystal structure can be formed.

Next, a mask is formed over the seed crystal layer 214b including crystals each having the first crystal structure, and then the oxide semiconductor film 214a including crystals each having the second crystal structure and the seed crystal layer 214b including crystals each having the first crystal structure are selectively etched with use of the mask, so that the oxide semiconductor film 215a including crystals each having the second crystal structure and the seed crystal layer 215b including crystals each having the first crystal structure are formed. Note that the oxide semiconductor film 215a including crystals each having the second crystal structure and the seed crystal layer 215b including crystals each having the first crystal structure are correctively referred to as the semiconductor film 215 having a hetero structure. After that, the mask is removed.

Next, the gate insulating film 217 is formed over the oxide insulating film 202, the pair of electrodes 216, and the semiconductor film 215 having a heterostructure. Then, the gate electrode 218 is formed over the gate insulating film 217.

After that, the insulating film 219 is formed over the gate insulating film 217 and the gate electrode 218. Then, after a mask is formed over the insulating film 219, the gate insulating film 217 and the insulating film 219 are partially etched to form opening portions. Then, the wirings 220 which are connected to the pair of electrodes 216 through the opening portions may be formed (see FIG. 10C).

The gate insulating film 217 can be formed as appropriate by using a material and a formation method which are similar to those of the gate insulating film 207 described in Embodiment 2.

The gate electrode 218 can be formed as appropriate by using a material and a formation method which are similar to those of the gate electrode 208 described in Embodiment 2.

The insulating film 219 can be formed as appropriate by using a material and a formation method which are similar to those of the insulating film 209 described in Embodiment 2.

The wirings 220 can be formed as appropriate by using a material and a formation method which are similar to those of the pair of electrodes 216.

Through the above steps, a transistor whose channel region includes a semiconductor film having a heterostructure, which includes a hexagonal crystal region in which atoms are bonded to form a hexagonal shape in the a-b plane and c-axis alignment, can be manufactured.

The semiconductor film having a heterostructure described in this embodiment has high crystallinity and high uniformity in a region which is in the vicinity of an interface between the semiconductor film and the gate insulating film. Thus, a transistor with stable electric characteristics and high reliability can be obtained. Further, by using the semiconductor film having a heterostructure, which includes atoms bonded to form a hexagonal shape in the a-b plane and a c-axis-aligned hexagonal crystal structure, for a channel region of a transistor, the amount of change in the threshold voltage of the transistor between before and after light irradiation or a bias-temperature (BT) test performed on the transistor is small, and the transistor can have stable electric characteristics.

This embodiment can be combined with any of the other embodiments in this specification as appropriate.

(Embodiment 4)

Figure 11A:
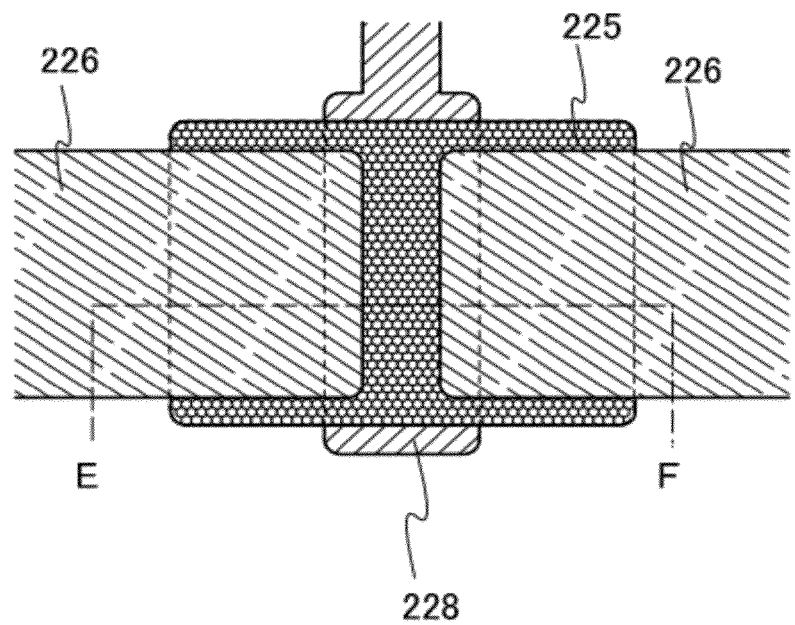
FIGS. 11A and 11B illustrate a structure of a transistor according to an embodiment.

In this embodiment, a structure of a transistor which is different from the transistors in Embodiment 2 and Embodiment 3 and a manufacturing method thereof will be described with reference to FIGS. 11A and 11B and FIGS. 12A to 12D. In this embodiment, a gate electrode is provided between an oxide insulating film and a gate insulating film, which is different from Embodiment 2 and Embodiment 3. In other words, while the top-gate transistors are described in Embodiment 2 and Embodiment 3, a bottom-gate transistor is described in this embodiment. Note that FIG. 11B corresponds to a cross-sectional view along a dot-dash line E-F in FIG. 11A which is a top view. In FIG. 11A, the substrate 201, the oxide insulating film 202, a gate insulating film 227, and an insulating film 229 are omitted. FIGS. 12A to 12D are cross-sectional views illustrating manufacturing steps of the transistor illustrated in FIG. 11B.

Figure 11B:
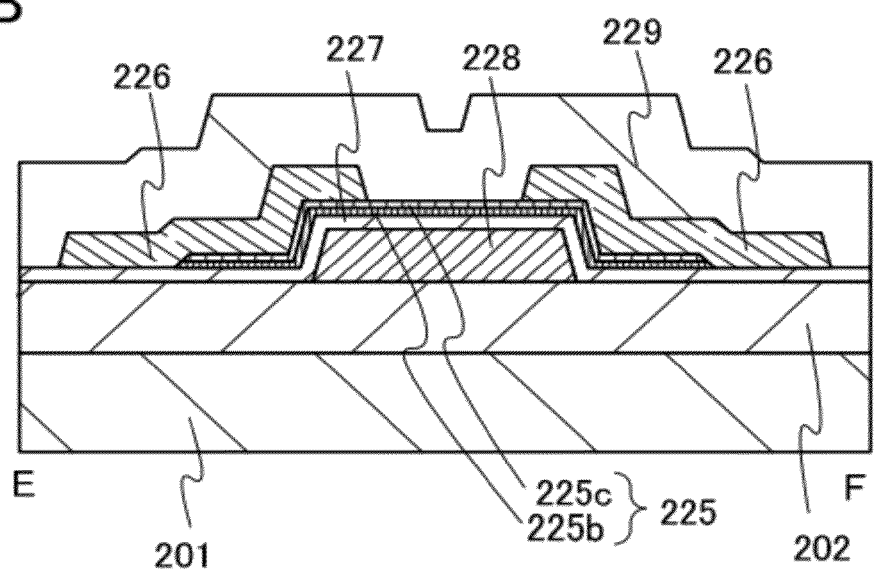

The transistor illustrated in FIG. 11B includes: the oxide insulating film 202 formed over the substrate 201; a gate electrode 228 formed over the oxide insulating film 202; the gate insulating film 227 covering the oxide insulating film 202 and the gate electrode 228; a semiconductor film 225 having a heterostructure overlapping with the gate electrode 228 with the gate insulating film 227 positioned therebetween; and a pair of electrodes 226 serving as a source electrode and a drain electrode in contact with the semiconductor film 225 having a heterostructure. Further, the insulating film 229 covering the gate insulating film 227, the semiconductor film 225 having a heterostructure, and the pair of electrodes 226 may be provided.

The semiconductor film 225 having a heterostructure has a structure in which a seed crystal layer 225b including crystals each having a first crystal structure, which is in contact with the gate insulating film 227, and an oxide semiconductor film 225c including crystals each having a second crystal structure, which is in contact with the seed crystal layer 225b including crystals each having the first crystal structure, are stacked.

The crystals each having the second crystal structure grow in the oxide semiconductor film 225c with use of the crystals each having the first crystal structure included in the seed crystal layer 225b as a seed crystal.

The crystals each having the first crystal structure included in the seed crystal layer 225b are hexagonal crystals. The crystals each having the second crystal structure included in the oxide semiconductor film 225c are hexagonal crystals which are different from the hexagonal crystal of the first crystal structure.

As in Embodiment 2, the first crystal structure and the second crystal structure are hexagonal crystal structures; therefore, a hexagonal lattice image can be observed from the c-axis direction.

Each of the seed crystal layer 225b including crystals each having the first crystal structure and the oxide semiconductor film 225c including crystals each having the second crystal structure is neither single crystal nor entirely in an amorphous state, and includes a c-axis-aligned crystal region.

Next, a method for manufacturing the transistor illustrated in FIG. 11B is described with reference to FIGS. 12A to 12D.

Figure 12A:
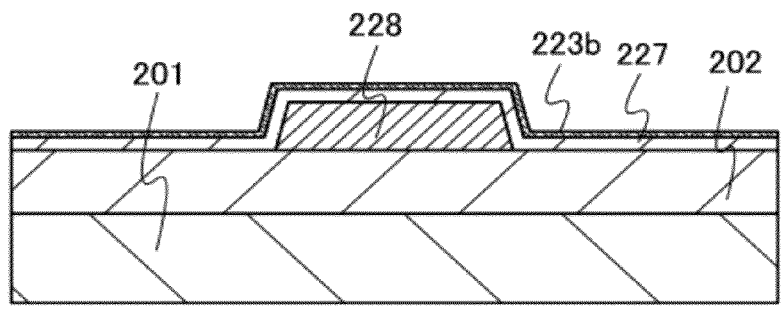
FIGS. 12A to 12D illustrate a manufacturing method of a transistor according to an embodiment.

As illustrated in FIG. 12A, the oxide insulating film 202 is formed over the substrate 201 as in Embodiment 2. The gate electrode 228 is formed over the oxide insulating film 202. The gate insulating film 227 is formed over the oxide insulating film 202 and the gate electrode 228. Then, a first oxide semiconductor film 223b is formed over the gate insulating film 227.

The gate electrode 228 and the gate insulating film 227 can be formed as appropriate by using materials and formation methods which are similar to those of the gate electrode 208 and the gate insulating film 207 described in Embodiment 2.

The first oxide semiconductor film 223b which becomes a seed crystal layer later can be formed as appropriate by using a material and a formation method which are similar to those of the second oxide semiconductor film 203b described in Embodiment 2.

Next, in a manner similar to that in Embodiment 2, first heat treatment is performed. The first heat treatment allows crystal growth to begin from a surface of the first oxide semiconductor film 223b toward the gate insulating film 227, so that a seed crystal layer 224b including crystals each having a first crystal structure is formed. Further, the seed crystal layer 224b including crystals each having the first crystal structure includes a c-axis-aligned crystal region.

Figure 12B:
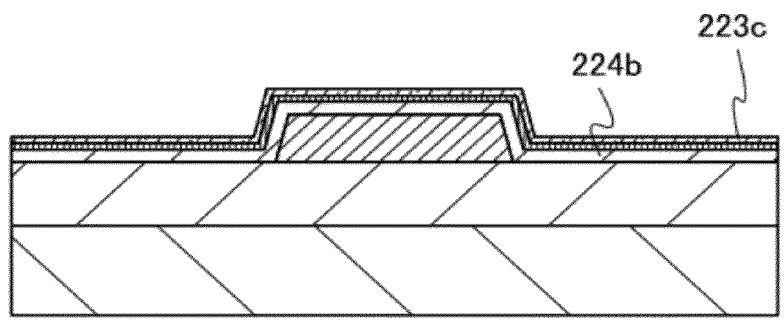
Figure 12C:
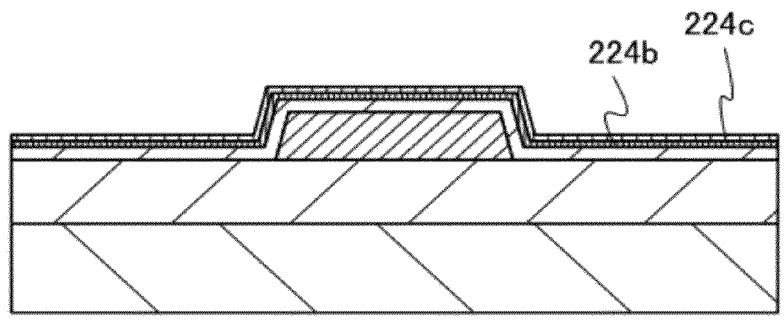

Then, a second oxide semiconductor film 223c is formed over the seed crystal layer 224b including crystals each having the first crystal structure (see FIG. 12B). The second oxide semiconductor film 223c can be formed as appropriate by using a material and a formation method which are similar to those of the first oxide semiconductor film 203a described in Embodiment 2.

Next, second heat treatment is performed. This heat treatment allows crystal growth to begin from the interface with the seed crystal layer 224b including crystals each having the first crystal structure toward the second oxide semiconductor film 223c, so that the second oxide semiconductor film 223c becomes an oxide semiconductor film 224c including crystals each having a second crystal structure. The oxide semiconductor film 224c including crystals each having the second crystal structure includes a c-axis-aligned crystal region (see FIG. 12C).

Through the above steps, the seed crystal layer 224b including crystals each having the first crystal structure and the oxide semiconductor film 224c including crystals each having the second crystal structure can be formed.

Next, a mask is formed over the oxide semiconductor film 224c including crystals each having the second crystal structure, and then the seed crystal layer 224b including crystals each having the first crystal structure and the oxide semiconductor film 224c including crystals each having the second crystal structure are selectively etched with use of the mask, so that the seed crystal layer 225b including crystals each having the first crystal structure and the oxide semiconductor film 225c including crystals each having the second crystal structure are formed. Note that the seed crystal layer 225b including crystals each having the first crystal structure and the oxide semiconductor film 225c including crystals each having the second crystal structure are correctively referred to as the semiconductor film 225 having a heterostructure. After that, the mask is removed.

Next, in a manner similar to that in Embodiment 2, the pair of electrodes 226 is formed.

Figure 12D:
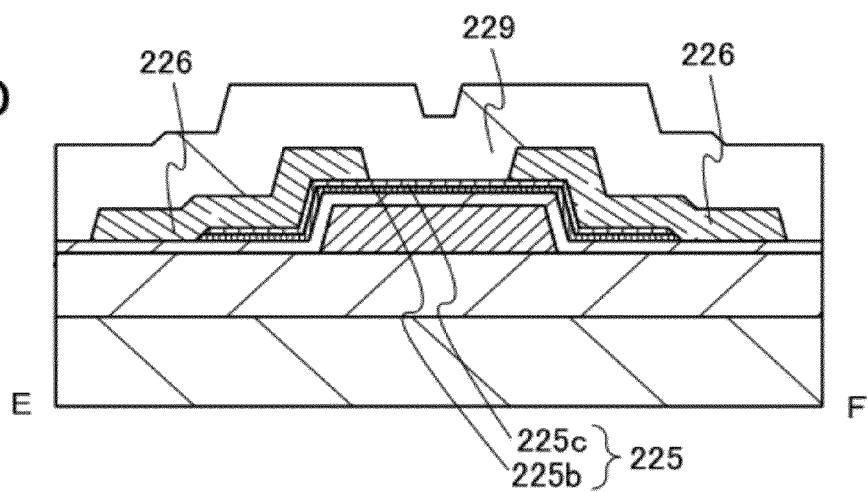

Next, the insulating film 229 may be formed over the gate insulating film 227, the pair of electrodes 226, and the semiconductor film 225 having a heterostructure (see FIG. 12D). The insulating film 229 can be formed as appropriate by using a material and a formation method which are similar to those of the insulating film 209 described in Embodiment 2.

Through the above steps, a transistor whose channel region includes a semiconductor film having a heterostructure, which includes a hexagonal crystal region in which atoms are bonded to form a hexagonal shape in the a-b plane and c-axis alignment can be manufactured.

Note that a channel-etched transistor is described in this embodiment; however, this embodiment can be applied to a channel protective transistor.

The semiconductor film having a heterostructure described in this embodiment has high crystallinity and high uniformity in a region which is in the vicinity of an interface between the semiconductor film and the gate insulating film. Thus, a transistor with stable electric characteristics and high reliability can be obtained. Further, by using the semiconductor film having a heterostructure, which includes atoms bonded to form a hexagonal shape in the a-b plane and a c-axis-aligned hexagonal crystal structure, for a channel region of a transistor, the amount of change in the threshold voltage of the transistor between before and after light irradiation or a bias-temperature (BT) test performed on the transistor is small, and the transistor can have stable electric characteristics.

Note that an oxynitride semiconductor has a smaller energy gap than an oxide semiconductor, and thus carriers easily flow therein. Therefore, by forming the first oxide semiconductor film 223b which is in contact with the gate insulating film 227, with use of an oxynitride semiconductor film, a transistor having favorable electric characteristics can be manufactured.

This embodiment can be combined with any of the other embodiments in this specification as appropriate.

(Embodiment 5)

In this embodiment, an example in which at least part of a driver circuit and a transistor to be disposed in a pixel portion are formed over one substrate in a display device will be described.

The transistor disposed in the pixel portion is formed according to Embodiment 2 or 3. Since the transistor described in Embodiment 2 or 3 is an n-channel transistor, some of driver circuits that can be constituted by n-channel transistors among the driver circuits are formed over a substrate where the transistor in the pixel portion is formed.

Figure 13A:
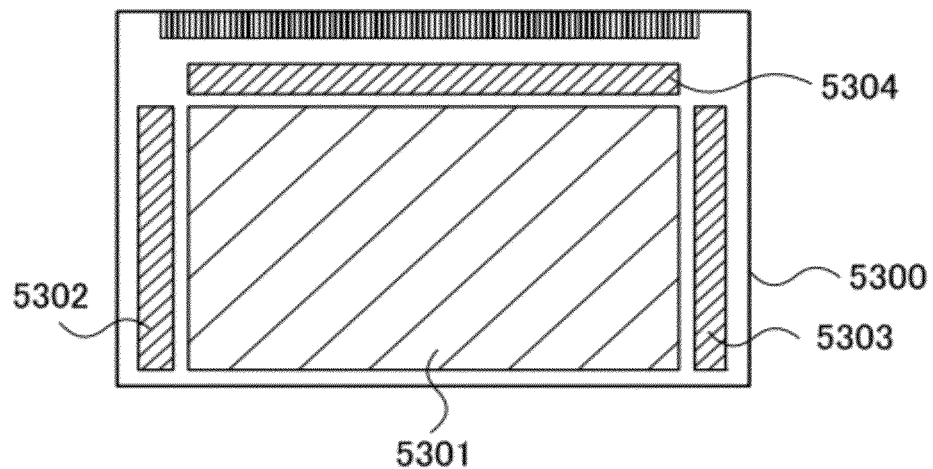
FIGS. 13A to 13C are a block diagram and equivalent circuit diagrams according to an embodiment.

FIG. 13A illustrates an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 are arranged and a plurality of scan lines extended from the first scan line driver circuit 5302 and the second scan line driver circuit 5303 are arranged. Note that pixels which include display elements are provided in a matrix in respective regions where the scan lines and the signal lines intersect with each other. Further, the substrate 5300 in the display device is connected to a timing control circuit (also referred to as a controller or a controller IC) through a connection point such as a flexible printed circuit (FPC).

In FIG. 13A, the first scan line driver circuit 5302, the second scan line driver circuit 5303, and the signal line driver circuit 5304 are formed over the substrate 5300 over which the pixel portion 5301 is also formed. Accordingly, the number of components of part of the drive circuit which is provided outside and the like are reduced, so that reduction in cost can be achieved. Further, if the driver circuit is provided outside the substrate 5300, wirings would need to be extended and the number of connections of wirings would be increased, but by providing the driver circuit over the substrate 5300, the number of connections of the wirings can be reduced. Accordingly, improvement in reliability and yield can be achieved.

Figure 13B:
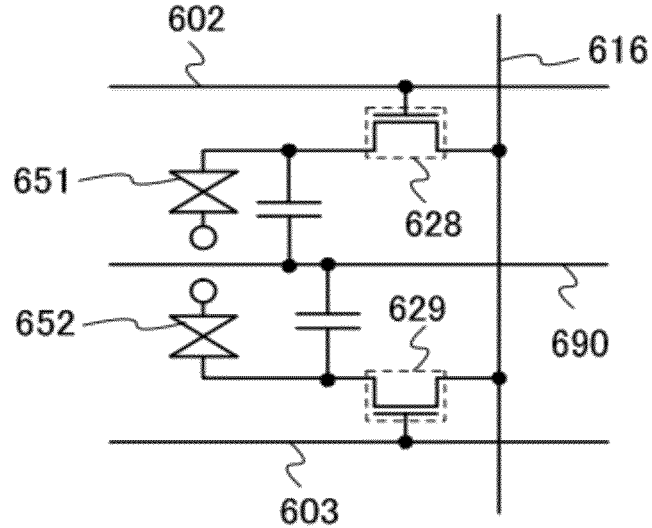

FIG. 13B illustrates an example of a circuit configuration of the pixel portion. Here, a pixel structure of a VA liquid crystal display panel is shown.

In this pixel structure, a plurality of pixel electrode layers are provided in one pixel, and transistors are connected to respective pixel electrode layers. The transistors are driven by different gate signals. In other words, signals applied to individual pixel electrode layers in a multi-domain pixel are controlled independently.

A gate wiring 602 of a transistor 628 and a gate wiring 603 of a transistor 629 are separated so that different gate signals can be given thereto. In contrast, a source or drain electrode layer 616 functioning as a data line is used in common for the transistors 628 and 629. As each of the transistors 628 and 629, any of the transistors described in Embodiment 2 or 3 can be used as appropriate.

A first pixel electrode layer and a second pixel electrode layer have different shapes and are separated by a slit. The second pixel electrode layer is provided so as to surround the external side of the first pixel electrode layer which is spread in a V shape. Timing of voltage application is made to vary between the first and second pixel electrode layers by the transistors 628 and 629 in order to control alignment of the liquid crystal. The transistor 628 is connected to the gate wiring 602, and the transistor 629 is connected to the gate wiring 603. When different gate signals are supplied to the gate wiring 602 and the gate wiring 603, operation timings of the transistor 628 and the transistor 629 can vary.

Further, a storage capacitor is formed using a capacitor wiring 690, a gate insulating layer as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 651. The second pixel electrode layer, a liquid crystal layer, and a counter electrode layer overlap with each other to form a second liquid crystal element 652. The pixel structure is a multi-domain structure in which the first liquid crystal element 651 and the second liquid crystal element 652 are provided in one pixel.

The pixel structure is not limited to that illustrated in FIG. 13B. For example, a switch, a resistor, a capacitor, a transistor, a sensor, a logic circuit, or the like may be added to the pixel illustrated in FIG. 13B.

In this embodiment, an example of the VA liquid crystal display panel is shown; however, there is no particularly limitation, and the present invention can be applied to various modes of liquid crystal display devices. For example, as a method for improving a viewing angle characteristic, the present invention can be applied to a lateral electric field method (also referred to as IPS mode) in which an electric field in the horizontal direction to the main surface of the substrate is applied to the liquid crystal layer.

For example, in an IPS liquid crystal display panel, liquid crystal exhibiting a blue phase for which an alignment film is unnecessary is preferably used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed at 5 wt. % or more is used for a liquid crystal layer of a liquid crystal element in order to improve the temperature range. The liquid crystal composition which includes a liquid crystal exhibiting a blue phase and a chiral agent has a short response time of 1 msec or less, and in addition, has optical isotropy, which makes the alignment process unneeded and a viewing angle dependence small.

Moreover, in order to improve moving-image characteristics of a liquid crystal display device, there is a driving technique by which a plane light source as a backlight is formed using a plurality of LEDs (light-emitting diodes), a plurality of EL light sources, or the like and each light source of the plane light source is lit independently to perform intermittent lighting driving within one frame period (e.g., a field sequential method). As the plane light source, three or more kinds of LEDs may be used and an LED emitting white light may be used. When light sources of three or more kinds of colors (e.g., red (R), green (G), and blue (B)) different from each other are used as a plane light source, color display can be made without a color filter. Further, in the case where an LED emitting white light is used as a plane light source, a color filter is used to achieve color display. Since a plurality of LEDs can be controlled independently, the light emission timing of LEDs can be synchronized with the timing at which a liquid crystal layer is optically modulated. By this driving technique, the LEDs can be partly turned off; therefore, particularly in the case of displaying a picture including a black display region in most of a screen, consumed power can be decreased.

Figure 13C:
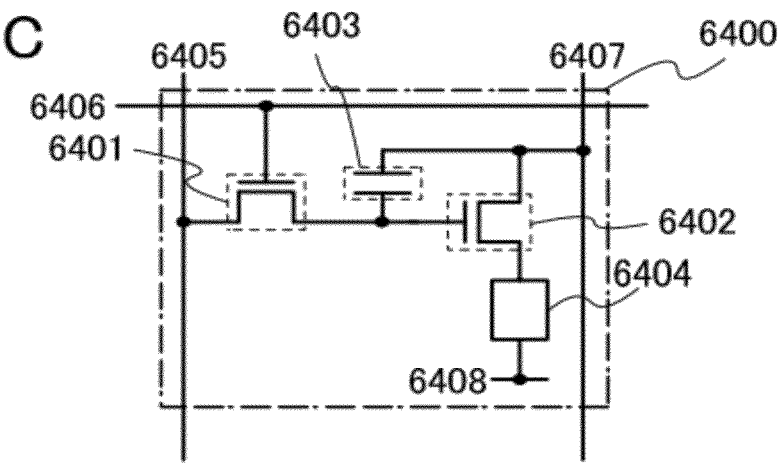

FIG. 13C shows another example of a circuit configuration of the pixel portion. Here, a pixel structure of a display panel using an organic EL element is shown.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 13C illustrates an example of a pixel structure as an example of a semiconductor device, which can be driven by a digital time grayscale method.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate electrode layer of the switching transistor 6401 is connected to a scan line 6406, a first electrode (one of a source electrode layer and a drain electrode layer) of the switching transistor 6401 is connected to a signal line 6405, and a second electrode (the other of the source electrode layer and the drain electrode layer) of the switching transistor 6401 is connected to a gate electrode layer of the driver transistor 6402. The gate electrode layer of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential which is lower than a high power supply potential when the high power supply potential that is set to the power supply line 6407 is a reference. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that the capacitor 6403 can be omitted by using gate capacitance of the driver transistor 6402. The gate capacitance of the driving transistor 6402 may be formed between the channel formation region and the gate electrode layer.

In the case of a voltage-input voltage-driving method, a video signal is input to the gate electrode layer of the driving transistor 6402 so that the driving transistor 6402 is in either of two states of being sufficiently turned on and turned off. That is, the driver transistor 6402 operates in a linear region. Since, the driving transistor 6402 operates in a linear region, the voltage higher than the voltage of the power supply line 6407 is applied to the gate electrode layer of the driving transistor 6402. Note that a voltage higher than or equal to the voltage which is the sum of the power supply line and Vth of the driver transistor 6402 is applied to the signal line 6405.

In the case of performing analog grayscale driving instead of digital time grayscale driving, the same pixel configuration as FIG. 13C can be employed by changing signal input.

In the case of performing analog grayscale driving, a voltage greater than or equal to the sum of the forward voltage of the light-emitting element 6404 and Vth of the driving transistor 6402 is applied to the gate electrode layer of the driving transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

The pixel structure is not limited to that illustrated in FIG. 13C. For example, a switch, a resistor, a capacitor, a sensor, a transistor, a logic circuit, or the like may be added to the pixel illustrated in FIG. 13C.

Figure 14A:
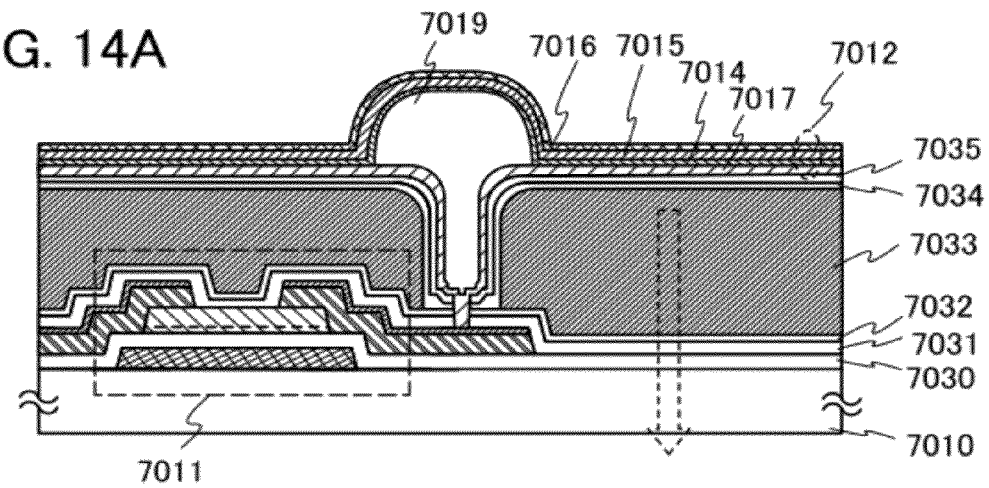
FIGS. 14A to 14C are cross-sectional views each illustrating a structure of a pixel portion according to an embodiment.
Figure 14B:
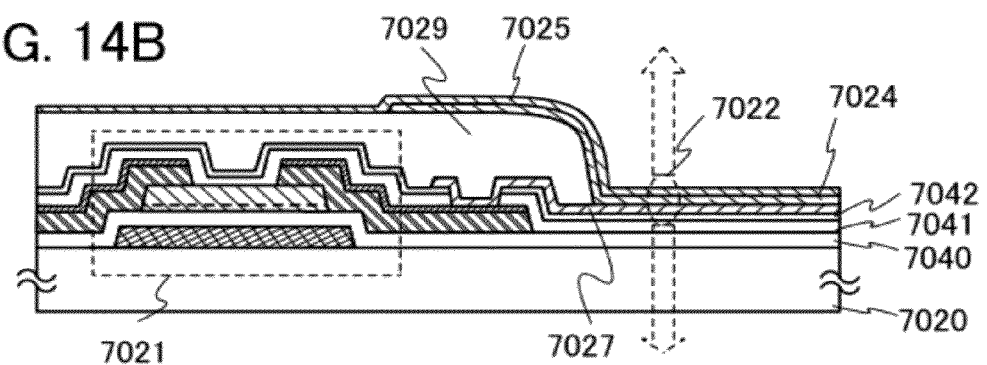
Figure 14C:
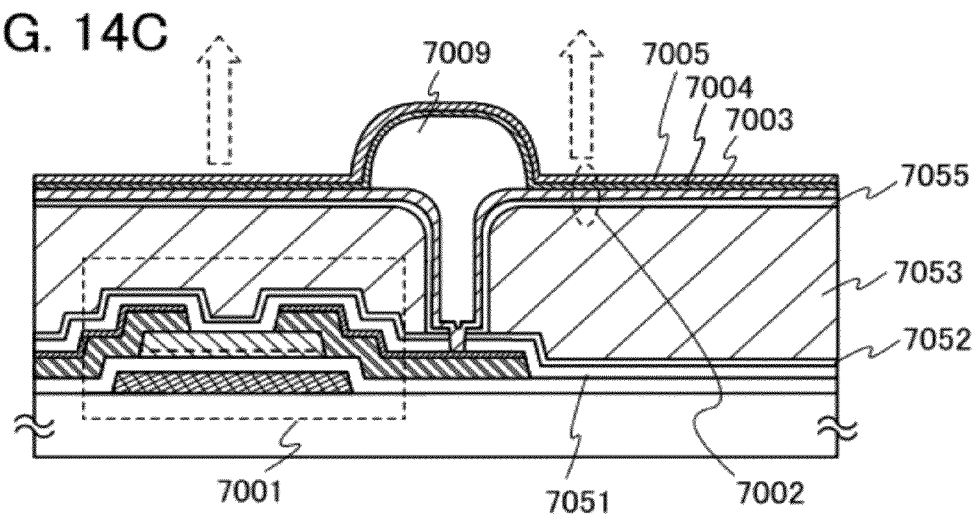

Next, a structure of the light-emitting element is described with reference to cross-sectional structures of a pixel, which are illustrated in FIGS. 14A to 14C. A cross-sectional structure of a pixel is described by taking an n-channel transistor for driving a light-emitting element as an example. Transistors 7011, 7021, and 7001 for driving light-emitting elements used in semiconductor devices illustrated in FIG. 14A, FIG. 14B, and FIG. 14C can be manufactured in a manner similar to that of the transistor described in Embodiment 4, each of which includes an oxide semiconductor layer including nitrogen used for a channel region.

At least one of the first electrode and the second electrode of the light-emitting element is formed using a conductive film which transmits visible light, and light emission is extracted from the light-emitting element. As the structure focused on the direction in which light emission is extracted, the following structures can be given: a top emission structure in which light is emitted from the side where a light-emitting element is formed over a substrate, without passing through the substrate over which the light-emitting element and the transistor are formed; a bottom emission structure in which light is emitted from the side where the light-emitting element is not formed through the substrate over which the light-emitting element is formed; and a dual emission structure in which light is emitted from both the substrate side on which the light-emitting element is formed and the other substrate side where light passes through the substrate. The pixel structure illustrated in FIG. 13C can be employed for light-emitting elements with any of the above light-emitting structures.

A light-emitting element having the bottom emission structure is described with reference to FIG. 14A. The light-emitting element having a bottom emission structure emits light in a direction indicated by arrows in FIG. 14A.

In FIG. 14A, the n-channel transistor described in Embodiment 4 is used for the transistor 7011 for driving a light-emitting element, but the transistor is not particularly limited thereto.

In FIG. 14A, a first electrode 7017 with a light-transmitting property is formed to be electrically connected to a source electrode or a drain electrode layer of the transistor 7011 for a light-emitting element, and thereover, an EL layer 7014 and a second electrode 7015 are stacked in this order.

The first electrode 7017 is formed using a conductive film which transmits visible light. For the conductive film which transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, and indium tin oxide to which silicon oxide is added can be given. Further, a metal thin film having a thickness that allows light transmission (preferably, approximately 5 nm to 30 nm) can also be used. For example, a film in which a 20-nm-thick aluminum film is stacked over another light-transmitting conductive film can be used.

For the second electrode 7015, it is preferable to use a material which efficiently reflects light emitted from the EL layer 7014 in order to improve light extraction efficiency. Note that the second electrode 7015 may have a stacked-layer structure. For example, a conductive film which transmits visible light may be formed on the side which is in contact with the EL layer 7014, and a light-blocking layer may be stacked thereover. As the light-blocking film, although a metal film or the like which efficiently reflects light emitted from the EL layer is preferable, for example, a resin or the like to which a black pigment is added can also be used.

Note that one of the first electrode 7017 and the second electrode 7015 functions as an anode, and the other functions as a cathode. It is preferable to use a substance having a high work function for the electrode which functions as an anode, and a substance having a low work function for the electrode which functions as a cathode.

As a material having a high work function, for example, ZrN, Ti, W, Ni, Pt, Cr, indium tin oxide (ITO), indium zinc oxide or the like can be used. As a material having a low work function, for example, an alkali metal such as Li or Cs, an alkaline earth metal such as Mg, Ca, or Sr, an alloy including any of these (such as Mg:Ag or Al:Li), a rare earth metal such as Yb or Er, or the like can be used.

Note that when power consumption is compared, it is preferable that the first electrode 7017 serve as a cathode and the second electrode 7015 serve as an anode because an increase in voltage of a driver circuit portion can be suppressed and power consumption can be reduced.

The EL layer 7014 includes at least the light-emitting layer and may be either a single layer or a stack of plural layers. As the structure in which a plurality of layers is stacked, a structure in which an anode, a hole injection layer, a hole transport layer, a light-emitting layer, an electron transport layer, and an electron injection layer are stacked in this order can be given as an example. Note that not all of these layers except the light-emitting layer are necessarily provided in the EL layer 7014. Further, each of these layers may be provided in duplicate or more. Specifically, in the EL layer 7014, a plurality of light-emitting layers may be overlapped each other or another hole injection layer may overlap the electron injection layer. Furthermore, another component such as an electron-relay layer may be added as appropriate as an intermediate layer, in addition to the charge generation layer.

A light-emitting element 7012 is provided with a partition wall 7019 to cover an end portion of the first electrode 7017. As the partition wall 7019, an inorganic insulating film or an organic polysiloxane film can be applied in addition to an organic resin film of polyimide, acrylic, polyamide, epoxy, or the like. It is particularly preferable that the partition wall 7019 be formed using a photosensitive resin material so that a side surface of the partition wall 7019 be formed as a tilted surface with a continuous curvature. In the case where a photosensitive resin material is used for the partition wall 7019, a step of forming a resist mask can be omitted. Further, the partition wall can be formed using an inorganic insulating film. When the inorganic insulating film is used for the partition wall, the amount of moisture contained in the partition wall can be reduced.

Note that a color filter layer 7033 is provided between the light-emitting element 7012 and a substrate 7010 (see FIG. 14A). A structure for emitting white light is employed for the light-emitting element 7012, whereby light emitted from the light-emitting element 7012 passes through the color filter layer 7033 and then passes through a second gate insulating layer 7031, a first gate insulating layer 7030, and the substrate 7010 so as to be emitted to the outside.

Plural kinds of the color filter layer 7033 may be formed. For example, a red color filter layer, a blue color filter layer, a green color filter layer, or the like can be provided in each pixel. Note that the color filter layer 7033 is formed by a droplet discharge method such as an ink jet method, a printing method, an etching method using a photolithography technique, or the like.

The color filter layer 7033 is covered with an overcoat layer 7034 and a protective insulating layer 7035 is further formed thereover. Although the overcoat layer 7034 is illustrated to have a small thickness in FIG. 14A, the overcoat layer 7034 is formed using a resin material such as an acrylic resin and has a function of reducing unevenness caused by the color filter layer 7033.

A contact hole which is formed in the second gate insulating layer 7031, an insulating layer 7032, the color filter layer 7033, the overcoat layer 7034, and the protective insulating layer 7035 and which reaches the drain electrode layer is formed in a position which overlaps with a partition wall 7019.

Next, a light-emitting element having a dual emission structure is described with reference to FIG. 14B. The light-emitting element having a dual emission structure emits light in a direction indicated by arrows in FIG. 14B.

In FIG. 14B, the n-channel transistor described in Embodiment 4 is used as an example for the transistor 7021 for driving a light-emitting element, but the transistor is not particularly limited thereto.

In FIG. 14B, a first electrode 7027 with a light-transmitting property is formed to be electrically connected to a source electrode layer or a drain electrode layer of the transistor 7021 for driving a light-transmitting element, and thereover, an EL layer 7024 and a second electrode 7025 are stacked in this order.

The first electrode 7027 and the second electrode 7025 are each formed using a conductive film which transmits visible light. The material which can be used for the first electrode 7017 of FIG. 14A can be used for the conductive film which transmits visible light. Thus, as the detail description, the above description of the first electrode 7017 is referred to.

Note that one of the first electrode 7027 and the second electrode 7025 functions as an anode, and the other functions as a cathode. It is preferable to use a substance having a high work function for the electrode which functions as an anode, and a substance having a low work function for the electrode which functions as a cathode.

The EL layer 7024 may be formed using a single layer or by stacking a plurality of layers. The structure and the material which can be used for the EL layer 7014 in FIG. 14A can be applied to the EL layer 7024. Thus, as the detail description, the above description of the EL layer 7014 is referred to.

In addition, a light-emitting element 7022 is provided with a partition wall 7029 which covers an end portion of the first electrode 7027. The structure and the material which can be used for the partition wall 7019 in FIG. 14A can be applied to the partition wall 7029. Thus, as the detail description, the above description of the partition wall 7019 is referred to.

In the case of the element structure illustrated in FIG. 14B, light is emitted from the light-emitting element 7022 to both the second electrode 7025 side and the first electrode 7027 side as indicated by arrows, and light emitted to the first electrode 7027 side passes through a second gate insulating layer 7041, an insulating layer 7042, a first gate insulating layer 7040, and a substrate 7020.

In the structure of FIG. 14B, when full color display is performed, for example, the light-emitting element 7022 is used as a green light-emitting element, one of adjacent light-emitting elements is used as a red light-emitting element, and the other is used as a blue light-emitting element. Alternatively, a light-emitting display device capable of full color display may be manufactured using four kinds of light-emitting elements which include a white light-emitting element in addition to three kinds of light-emitting elements.

A light-emitting element having a top emission structure is described with reference to FIG. 14C. The light-emitting element having a top emission structure emits light in a direction indicated by arrows in FIG. 14C.

In FIG. 14C, the n-channel transistor described in Embodiment 4 is used for the transistor 7001 for driving a light-emitting element, but the transistor is not particularly limited thereto.

In FIG. 14C, a first electrode 7003 is formed to be electrically connected to a source electrode layer or a drain electrode layer of the transistor 7001 for driving a light-emitting element, and thereover, an EL layer 7004 and a second electrode 7005 are stacked in this order.

For the first electrode 7003, it is preferable to use a material which efficiently reflects light emitted from the EL layer 7004 in order to improve light extraction efficiently. Note that the first electrode 7003 may have a stacked-layer structure. For example, a conductive film that transmits visible light may be formed on the side that is in contact with the EL layer 7004, so that the conductive film is stacked over a light-blocking film. As the light-blocking film, although a metal film or the like which efficiently reflects light emitted from the EL layer is preferable, for example, a resin or the like to which a black pigment is added can also be used.

The second electrode 7005 is formed using a conductive film which transmits visible light. The material which can be used for the first electrode 7017 of FIG. 14A can be used for the conductive film which transmits visible light. Thus, as the detail description, the above description of the first electrode 7017 is referred to.

Note that one of the first electrode 7003 and the second electrode 7005 functions as an anode, and the other functions as a cathode. It is preferable to use a substance having a high work function for the electrode which functions as an anode, and a substance having a low work function for the electrode which functions as a cathode.

The EL layer 7004 may be formed using a single layer or by stacking a plurality of layers. The structure and the material which can be used for the EL layer 7014 in FIG. 14A can be applied to the EL layer 7004. Thus, as the detail description, the above description of the EL layer 7014 is referred to.

Further, a light-emitting element 7002 is provided with a partition wall 7009 which covers an end portion of the first electrode 7003. As for the partition wall 7009, the structure and the material which can be used for the partition wall 7019 in FIG. 14A can be used. Thus, as the detail description, the above description of the partition wall 7019 is referred to.

In FIG. 14C, the source electrode layer or the drain electrode layer of the transistor 7001 for driving a light-emitting element is electrically connected to the first electrode 7003 through a contact hole provided in a protective insulating layer 7052 and an insulating layer 7055. A planarization insulating layer 7053 can be formed using a resin material such as polyimide, acrylic, benzocyclobutene, polyamide, or epoxy. Other than such resin materials, a low-dielectric constant material (a low-k material), a siloxane-based resin, or the like can be used. Note that the planarization insulating layer 7053 may be formed by stacking a plurality of insulating films formed using these materials. There is no particular limitation on the method for forming the planarization insulating layer 7053, and the planarization insulating layer 7053 can be formed, depending on the material, by a method such as a sputtering method, an SOG method, spin coating, dip coating, spray coating, a droplet discharge method (such as an inkjet method, screen printing, offset printing, or the like), or the like.

In the structure of FIG. 14C, in the case where full color display is performed, for example, a green light-emitting element is used as the light-emitting element 7002, one of adjacent light-emitting elements is a red light-emitting element, and the other is a blue light-emitting element. Alternatively, a light-emitting display device capable of full color display may be manufactured using four kinds of light-emitting elements which include a white light-emitting element in addition to three kinds of light-emitting elements.

In the structure of FIG. 14C, a light-emitting display device capable of full color display may be manufactured in such a way that all of a plurality of light-emitting elements which are arranged are white light-emitting elements and a sealing substrate having a color filter or the like is arranged on the light-emitting element 7002. When a material which exhibits monochromatic light such as white light is formed and combined with color filters or color conversion layers, full-color display can be performed.

Needless to say, display of monochromatic light can also be performed. For example, a lighting device may be formed utilizing white light emission; alternatively, an area-color light-emitting device using monochromatic light emission may be formed.

Moreover, an optical film such as a polarizing film, one of examples of which is a circular polarizing plate, may be provided when needed.

Note that the example is described in which a transistor which controls the driving of a light-emitting element (a transistor for driving a light-emitting element) is electrically connected to the light-emitting element; however, a structure may be employed in which a transistor for current control is connected between the transistor for driving a light-emitting element and the light-emitting element.

Note that the structure of the semiconductor device described in this embodiment is not limited to those illustrated in FIGS. 14A to 14C and can be modified in various ways based on the spirit of techniques of the present invention.

(Embodiment 6)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the display device described in any of the above embodiments will be described.

FIG. 15A illustrates a portable information terminal, which includes s main body 3001, a housing 3002, display portions 3003a and 3003b, and the like. The display portion 3003b functions as a touch panel. By touching a keyboard 3004 displayed on the display portion 3003b, a screen can be operated, and text can be input. Needless to say, the display portion 3003a may functions as a touch panel. A liquid crystal panel described in Embodiment 5 or an organic light-emitting panel is manufactured by using the transistor described in any of Embodiments 2 to 4 as a switching element and applied to the display portion 3003a or 3003b, whereby a portable information terminal can be provided.

The portable information terminal illustrated in FIG. 15A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 15A may transmit and receive data wirelessly. Through wireless communication, desired book data or the like can be purchased and downloaded from an electronic book server.

Further, in the portable information terminal illustrated in FIG. 15A, one of the two display portions, the display portion 3003a and the display portion 3003b, can be detached, the case of which is illustrated in FIG. 15B. The display portion 3003a also functions as a panel having a touch input function, and thus further reduction in weight of the portable information terminal of when it is carried can be achieved. The housing 3002 can be held by one hand and can operate by the other hand, which is convenient.

Furthermore, when the housing 3002 illustrated in FIG. 15B functions as an antenna, a microphone, or a wireless communication device, the housing 3002 may be used as a mobile phone handset.

FIG. 15C illustrates an example of a mobile phone handset. A mobile phone handset 5005 illustrated in FIG. 15C is provided with a display portion 5001 incorporated in a housing, a display panel 5003 attached to a hinge 5002, operation buttons 5004, a speaker, a microphone, and the like.

In the mobile phone handset 5005 illustrated in FIG. 15C, the display panel 5003 is slid to overlap the display portion 5001, and the display panel 5003 also functions as a cover having a light-transmitting property. The display panel 5003 is a display panel including the light-emitting element having a dual emission structure illustrated in FIG. 14B in Embodiment 5, in which light emission is extracted through the surface opposite to the substrate side and the surface on the substrate side.

Since the light-emitting element having a dual emission structure is used for the display panel 5003, display can be performed also with the display portion 5001 overlapped; therefore, both the display portion 5001 and the display panel 5003 can perform display and the users can view both the displays. The display panel 5003 has a light-transmitting property and the view beyond the display panel can be seen. For example, when a map is displayed on the display portion 5001 and the location points of users are displayed using the display panel 5003, the present location can be recognized easily.

Further, in the case where the mobile phone handset 5005 is provided with an image sensor to be used as a television telephone, it is possible to make conversation with plural persons while their faces are displayed; therefore, a television conference or the like can be performed. For example, when the face of a single person or the faces of plural persons are displayed on the display panel 5003 and further the face of another person is displayed on the display portion 5001, users can make conversation while viewing the faces of two or more persons.

When a touch input button 5006 displayed on the display panel 5003 is touched with a finger or the like, data can be inputted. Further, the user can make a call or compose an e-mail by sliding the display panel 5003 and touching the operation buttons 5004 with a finger or the like.

FIG. 15D illustrates an example of a television set. In a television set 9600, a display portion 9603 is incorporated in a housing 9601. The display portion 9603 can display images. Here, the housing 9601 is supported on a stand 9605 provided with a CPU. When the transistor described in any of Embodiments 2 to 4 is applied to the display portion 9603, the television set 9600 with high reliability can be obtained.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer is possible. A disk storage medium is inserted into the storage medium recording and reproducing portion 9602, and reading data stored in the storage medium and writing data to the storage medium can be performed. In addition, a picture, a video, or the like stored as data in an external memory 9606 inserted to the external memory slot can be displayed on the display portion 9603.

The methods and structures described in this embodiment can be combined as appropriate with any of the methods and structures described in the other embodiments.

This application is based on Japanese Patent Application serial no. 2010-267924 filed with Japan Patent Office on Nov. 30, 2010, the entire contents of which are hereby incorporated by reference.

What is claimed is:

1. A semiconductor film having a heterostructure, comprising:
   a first semiconductor layer over an insulating surface, the first semiconductor layer comprising a first crystal that has a first crystal structure; and
   a second semiconductor layer over the first semiconductor layer, the second semiconductor layer comprising an oxide semiconductor, the oxide semiconductor comprising a second crystal that has a second crystal structure;
   wherein:
   the first semiconductor layer is in contact with the insulating surface;
   the second semiconductor layer is in contact with the first semiconductor layer;
   the first semiconductor layer has higher crystallinity than the second semiconductor layer;
   the first crystal structure is a wurtzite-type structure;
   the second crystal structure is a hexagonal crystal structure other than the wurtzite-type structure; and
   wherein the first semiconductor layer contains nitrogen at a concentration higher than or equal to 0.1 at. % and lower than 5 at. %.

2. The semiconductor film having a heterostructure according to claim 1, wherein a thickness of the first semiconductor layer is greater than or equal to 0.1 nm and less than or equal to 10 nm.

3. The semiconductor film having a heterostructure according to claim 1, wherein the first semiconductor layer contains indium nitride or gallium nitride.

4. The semiconductor film having a heterostructure according to claim 1, wherein the first semiconductor layer contains zinc, indium, gallium, oxygen, and nitrogen.

5. The semiconductor film having a heterostructure according to claim 1, wherein the second semiconductor layer contains nitrogen at a concentration higher than or equal to $1 \times 10^{17}/cm^3$ and lower than $5 \times 10^{19}/cm^3$.

6. A semiconductor film having a heterostructure, comprising:
   a first semiconductor layer over an insulating surface, the first semiconductor layer comprising a first crystal that has a first crystal structure; and
   a second semiconductor layer over the first semiconductor layer, the second semiconductor layer comprising an oxide semiconductor, the oxide semiconductor comprising a second crystal that has a second crystal structure;
   wherein:
   the first semiconductor layer is in contact with the insulating surface;
   the second semiconductor layer is in contact with the first semiconductor layer;
   the first semiconductor layer has higher crystallinity than the second semiconductor layer;
   the first crystal structure is a wurtzite-type structure;
   the second crystal structure is an $YbFe_2O_4$ structure or an $Yb_2Fe_3O_7$ structure; and
   the first semiconductor layer contains nitrogen at a concentration higher than or equal to 0.1 at. % and lower than 5 at. %.

7. The semiconductor film having a heterostructure according to claim 6, wherein a thickness of the first semiconductor layer is greater than or equal to 0.1 nm and less than or equal to 10 nm.

8. The semiconductor film having a heterostructure according to claim 6, wherein the first semiconductor layer contains indium nitride or gallium nitride.

9. The semiconductor film having a heterostructure according to claim 6, wherein the first semiconductor layer contains zinc, indium, gallium, oxygen, and nitrogen.

10. The semiconductor film having a heterostructure according to claim 6, wherein the second semiconductor layer contains nitrogen at a concentration higher than or equal to $1\times10^{17}/cm^3$ and lower than $5\times10^{19}/cm^3$.

11. A semiconductor element having a heterostructure, comprising:
a gate insulating layer over a gate electrode;
a first semiconductor layer over the gate insulating layer, the first semiconductor layer comprising a first crystal that has a first crystal structure; and
a second semiconductor layer over the first semiconductor layer, the second semiconductor layer comprising an oxide semiconductor, the oxide semiconductor comprising anisotropic crystals each having a c-axis-aligned second crystal structure;
wherein:
the first semiconductor layer is in contact with the gate insulating layer;
the second semiconductor layer is in contact with the first semiconductor layer;
the first semiconductor layer has higher crystallinity than the second semiconductor layer;
the first crystal structure is a wurtzite-type structure;
the c-axis-aligned second crystal structure is a hexagonal crystal structure other than the wurtzite-type structure; and
the first semiconductor layer contains nitrogen at a concentration higher than or equal to 0.1 at. % and lower than 5 at. %.

12. A semiconductor device comprising the semiconductor element according to claim 11.

13. A semiconductor element having a heterostructure, comprising:
a gate insulating layer over a gate electrode;
a first semiconductor layer over the gate insulating layer, the first semiconductor layer comprising a first crystal that has a first crystal structure; and
a second semiconductor layer over the first semiconductor layer, the second semiconductor layer comprising an oxide semiconductor, the oxide semiconductor comprising anisotropic crystals each having a c-axis-aligned second crystal structure;
wherein:
the first semiconductor layer is in contact with the gate insulating layer;
the second semiconductor layer is in contact with the first semiconductor layer;
the first semiconductor layer has higher crystallinity than the second semiconductor layer;
the first crystal structure is a wurtzite-type structure;
the c-axis-aligned second crystal structure is an $YbFe_2O_4$ structure or an $Yb_2Fe_3O_7$ structure; and
the first semiconductor layer contains nitrogen at a concentration higher than or equal to 0.1 at. % and lower than 5 at. %.

14. A semiconductor device comprising the semiconductor element according to claim 13.

15. A method for manufacturing a semiconductor device, comprising the steps of:
forming a first semiconductor layer comprising a first crystal that has a first crystal structure;
forming a second semiconductor layer over the first semiconductor layer, the second semiconductor layer comprising an oxide semiconductor, the oxide semiconductor comprising a second crystal that has a second crystal structure; and
performing a heat treatment to the first semiconductor layer and the second semiconductor layer so that crystal growth proceeds in the second semiconductor layer from an interface with the first semiconductor layer, thereby a c-axis-aligned second crystal structure is formed in the second semiconductor layer;
wherein:
the first semiconductor layer has higher crystallinity than the second semiconductor layer;
the first crystal structure is a wurtzite-type structure;
the second crystal structure is a hexagonal crystal structure other than the wurtzite-type structure; and
the first semiconductor layer contains nitrogen at a concentration higher than or equal to 0.1 at. % and lower than 5 at. %.

16. The method for manufacturing a semiconductor device according to claim 15, wherein a thickness of the first semiconductor layer is greater than or equal to 0.1 nm and less than or equal to 10 nm.

17. The method for manufacturing a semiconductor device according to claim 15, wherein the first semiconductor layer contains indium nitride or gallium nitride.

18. The method for manufacturing a semiconductor device according to claim 15, wherein the first semiconductor layer contains zinc, indium, gallium, oxygen, and nitrogen.

19. The method for manufacturing a semiconductor device according to claim 15, wherein the second semiconductor layer contains nitrogen at a concentration higher than or equal to $1\times10^{17}/cm^3$ and lower than $5\times10^{19}/cm^3$.

* * * * *